US 7,379,190 B2
May 27, 2008

(12) United States Patent
Hill

(10) Patent No.: US 7,379,190 B2
(45) Date of Patent: May 27, 2008

(54) STAGE ALIGNMENT IN LITHOGRAPHY TOOLS

(75) Inventor: Henry A. Hill, Tucson, AZ (US)

(73) Assignee: Zygo Corporation, Middlefield, CT (US)

(*) Notice: Subject to any disclaimer, the term of this patent is extended or adjusted under 35 U.S.C. 154(b) by 356 days.

(21) Appl. No.: 11/029,521

(22) Filed: Jan. 5, 2005

(65) Prior Publication Data

US 2005/0151951 A1 Jul. 14, 2005

Related U.S. Application Data

(60) Provisional application No. 60/534,305, filed on Jan. 5, 2004.

(51) Int. Cl.
*G01B 11/02* (2006.01)
*G01B 11/00* (2006.01)

(52) U.S. Cl. ...................... 356/509; 356/401
(58) Field of Classification Search ........ 356/399–401, 356/486, 488, 493, 494, 498–500, 508–510, 356/497, 479; 355/53–55
See application file for complete search history.

(56) References Cited

U.S. PATENT DOCUMENTS

| | | |
|---|---|---|
| 4,711,573 A | 12/1987 | Wijntjes et al. |
| 4,790,651 A | 12/1988 | Brown et al. |
| 4,802,765 A | 2/1989 | Young et al. |
| 4,859,066 A | 8/1989 | Sommargren |
| 4,881,816 A | 11/1989 | Zanoni |
| 5,064,289 A | 11/1991 | Bockman |
| 5,114,234 A | 5/1992 | Otsuka et al. |
| 5,151,749 A | 9/1992 | Tanimoto et al. |
| 5,187,543 A | 2/1993 | Ebert |
| 5,663,793 A | 9/1997 | de Groot |
| 5,663,893 A | 9/1997 | Wampler et al. |
| 5,724,136 A | 3/1998 | Zanoni |

(Continued)

FOREIGN PATENT DOCUMENTS

JP 7-351078 12/1995

(Continued)

OTHER PUBLICATIONS

Bennett, S.J. . "A Double-Passed Michelson Interferometer." Optics Communications, 4:6, pp. 428-430, 1972.

(Continued)

*Primary Examiner*—Patrick J Connolly
(74) *Attorney, Agent, or Firm*—Fish & Richardson P.C.

(57) ABSTRACT

In general, in a first aspect, the invention features a lithography system that includes a stage for supporting a wafer, an illumination system including a radiation source and a lens assembly, wherein the illumination system is configured to direct radiation through a mask to produce spatially patterned radiation, and the lens assembly is configured to image the spatially patterned radiation onto the wafer, a first interferometry system configured to monitor a location of the stage within the lithography system as the stage moves relative to the illumination system, a second interferometry system configured to identify an alignment feature on a surface associated with the stage, and an electronic controller coupled to the interferometry systems, wherein the electronic controller is configured to determine information about a location of the stage when the alignment feature is identified.

39 Claims, 12 Drawing Sheets

U.S. PATENT DOCUMENTS

| | | |
|---|---|---|
| 5,757,160 A | 5/1998 | Kreuzer |
| 5,757,489 A | 5/1998 | Kawakami |
| 5,764,361 A | 6/1998 | Kato et al. |
| 5,764,362 A | 6/1998 | Hill et al. |
| 5,781,277 A | 7/1998 | Iwamoto |
| 5,790,253 A | 8/1998 | Kamiya |
| 5,801,832 A | 9/1998 | Van Den Brink |
| 5,838,485 A | 11/1998 | De Groot et al. |
| 5,862,164 A | 1/1999 | Hill |
| 5,877,843 A | 3/1999 | Takagi et al. |
| 5,917,844 A | 6/1999 | Hill |
| 5,970,077 A | 10/1999 | Hill |
| 6,008,902 A | 12/1999 | Rinn |
| 6,020,964 A | 2/2000 | Loopstra et al. |
| 6,040,096 A | 3/2000 | Kakizaki |
| 6,046,792 A | 4/2000 | Van Der Werf et al. |
| 6,124,931 A | 9/2000 | Hill |
| 6,134,007 A | 10/2000 | Naraki et al. |
| 6,137,574 A | 10/2000 | Hill |
| 6,157,660 A | 12/2000 | Hill |
| 6,159,644 A | 12/2000 | Hidetoshi |
| 6,160,619 A | 12/2000 | Magome |
| 6,181,420 B1 | 1/2001 | Badami et al. |
| 6,201,609 B1 | 3/2001 | Hill et al. |
| 6,208,424 B1 | 3/2001 | de Groot |
| 6,219,144 B1 | 4/2001 | Hill |
| 6,236,507 B1 | 5/2001 | Hill et al. |
| 6,246,481 B1 | 6/2001 | Hill |
| 6,252,667 B1 | 6/2001 | Hill |
| 6,252,668 B1 | 6/2001 | Hill |
| 6,271,923 B1 | 8/2001 | Hill |
| 6,304,318 B1 * | 10/2001 | Matsumoto ............... 355/53 |
| 6,313,918 B1 | 11/2001 | Hill et al. |
| 6,327,039 B1 | 12/2001 | de Groot et al. |
| 6,330,065 B1 | 12/2001 | Hill |
| 6,330,105 B1 | 12/2001 | Rozelle et al. |
| 6,384,899 B1 | 5/2002 | den Boef |
| 6,541,759 B1 | 4/2003 | Hill |
| 6,839,141 B2 | 1/2005 | Hill |
| 2001/0028456 A1 | 10/2001 | Nishi |
| 2001/0035959 A1 | 11/2001 | Hill |
| 2002/0048026 A1 | 4/2002 | Isshiki et al. |
| 2002/0089671 A1 | 7/2002 | Hill |
| 2003/0090675 A1 | 5/2003 | Fujiwara |

FOREIGN PATENT DOCUMENTS

| | | |
|---|---|---|
| JP | 10-260009 | 9/1998 |

OTHER PUBLICATIONS

Hines et al. Sub-Nonometer Laser Metrology—Some Techniques and Models. ESO Conference on High-Resolution Imaging by Interferometry II, pp. 1195-1204, 1991.

Bobroff, Norman. "Recent advances in displacement measuring interferometry." Meas. Sci. Technol. 4, pp. 907-926, 1993.

Oka et al. "Polarization heterodyne interferometry using another local oscillator beam." Optics Communications, 92, pp. 1-5, 1992.

Mauer, Paul. "Phase Compensation of Total Internal Reflection." J. Opt. Soc. Am., 56:9, pp. 1219-1221, 1966.

Player, M.A. "Polarization properties of a cube-corner reflector." J. Mod. Opt., 35:11, pp. 1813-1820, 1988.

* cited by examiner

STAGE ALIGNMENT IN LITHOGRAPHY TOOLS

CROSS-REFERENCE TO RELATED APPLICATIONS

This application claims priority under 35 USC § 119 to Provisional Patent Application No. 60/534,305, entitled "WAFER, WAFER CHUCK, AND WAFER STAGE METROLOGY SYSTEM ALIGNMENT AND CALIBRATION IN SINGLE AND MULTIPLE STAGE LITHOGRAPHY TOOLS," filed on Jan. 5, 2004, the entire contents of which are hereby incorporated by reference.

BACKGROUND

This invention relates to lithography systems and monitoring components in lithography systems using interferometers.

Lithography systems are commonly used in fabricating large-scale integrated circuits such as computer chips and the like. The function of a lithography system is to direct spatially patterned radiation onto a photoresist-coated wafer. The process involves determining which location of the wafer is to receive the radiation (alignment) and applying the radiation to the photoresist at that location (exposure).

In general, a lithography system, also referred to as a lithography tool, an exposure system or an exposure tool, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and wafer chuck and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

During exposure, the radiation source illuminates the patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are typically important components of the positioning mechanisms that control the positions of the wafer and reticle and register the reticle image on the wafer. Interferometry systems can be used to precisely measure the positions of each of the wafer stage and mask stage relative to other components of the exposure system, such as the lens assembly, radiation source or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

To properly position the wafer, the wafer includes alignment marks on the wafer surface that can be measured by dedicated sensors. Alternatively, or additionally, alignment marks can be included on the surface of the stage. The measured positions of the alignment marks define the location of the wafer within the tool. This information, along with a specification of the desired patterning of the wafer surface, guides the alignment of the wafer relative to the spatially patterned radiation. Based on such information, the translatable stage supporting the photoresist-coated wafer moves the wafer such that the radiation will expose the correct location of the wafer.

Overlay improvement is one of the five most difficult challenges down to and below 100 nm line widths (design rules), see for example the *Semiconductor Industry Roadmap*, p. 82 (1997). Overlay depends directly on the performance, i.e. accuracy and precision, of the distance measuring interferometers used to position the wafer and reticle (or mask) stages. Since a lithography tool may produce $50-100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

Furthermore, lithography tool throughput is also affected by the time it takes for a tool to execute alignment procedures. In a multiple stage lithography tool, for example, time is required for executing alignment procedures at both the load/unload and exposure positions of the multiple stage positions. The time for unloading a first wafer, loading a second wafer, and performing alignment procedures for the second wafer at the load/unload position can by design be less than the time for alignment procedures and exposure of a third wafer at the exposure position. Accordingly, the time for alignment procedures at the exposure position is not necessarily eliminated by the use of a multiple stage lithography tool and can therefore affect throughput of the multiple stage lithography tool. For multiple stage lithography tools where loaded wafer chucks are exchanged between the exposure and load/unload locations and the alignment of a wafer with respect to a corresponding wafer chuck is determined at the load/unload location, the time required to align the loaded wafer chuck wafer relative to the stage at the exposure location can affect throughput.

SUMMARY

In general, in a first aspect, the invention features a lithography system that includes a stage for supporting a wafer, an illumination system including a radiation source and a lens assembly, wherein the illumination system is configured to direct radiation through a mask to produce spatially patterned radiation, and the lens assembly is configured to image the spatially patterned radiation onto the wafer, a first interferometry system configured to monitor a location of the stage within the lithography system as the stage moves relative to the illumination system, a second interferometry system configured to identify an alignment feature on a surface associated with the stage, and an electronic controller coupled to the interferometry systems, wherein the electronic controller is configured to determine information about a location of the stage when the alignment feature is identified.

In general, in another aspect, the invention features an interferometry system for identifying an alignment feature on a surface associated with a stage within a lithography tool. The interferometry system includes an interferometer configured to direct two beams derived from a common light source along different paths and to combine light from the two beams that is reflected from the alignment feature to form an output beam comprising information about the location of the alignment feature with respect to the two beams.

In a further aspect, the invention features a lithography tool, including a stage for supporting a wafer, ari illumination system including a radiation source and a lens assembly, wherein the illumination system is configured to direct radiation through a mask to produce spatially patterned radiation, and the lens assembly is configured to image the spatially patterned radiation onto the wafer, a first interferometry system configured to monitor a location of the stage within the lithography system as the stage moves relative to the illumination system, the interferometry system, and an electronic controller coupled to the interferometry systems, wherein the electronic controller is configured to determine information about a location of the stage when the alignment feature is identified.

In general, in a further aspect, the invention features an apparatus, including a wafer stage having an alignment feature on a surface associated with the stage, the alignment feature having a first facet and a second facet opposite the first facet, wherein the first and second facets are non-parallel to a plane of the surface and each facet is configured reflect a beam from an interferometer designed to identify the alignment feature.

In general, in another aspect, the invention features a method that includes directing two beams derived from a common source along different paths to contact a surface associated with a wafer stage, and combining light from the two beams that is reflected from an alignment feature in the surface to form an output beam including information about the location of the alignment feature with respect to the two beams.

In general, in a further aspect, the invention features a method that includes monitoring a location of a stage within the lithography system including an illumination system as the stage moves relative to an illumination system, using an interferometry system to identify an alignment feature on a surface associated with the stage, and determining information about a location of the stage within the lithography system when the alignment feature is identified.

Embodiments of the invention can include one or more of the following features.

The information about a location of the stage when the alignment feature is identified can include a location of the stage along a first axis within the lithography system. The first interferometry system can be configured to monitor the location of the stage along the first axis and along a second axis within the lithography system as the stage moves relative to the illumination system, wherein the second axis is different from the first axis. The second interferometry system can be configured to identify a second alignment feature on a surface associated with the stage. The information can further include a location of the stage along the second axis within the lithography system. The first and second axes can be in a plane nominally parallel to a plane of the wafer.

The surface associated with the stage can be a surface of the stage. Alternatively, or additionally, the surface associated with the stage can be a surface of the wafer or a surface of a wafer chuck.

The alignment feature can be located within about 1 mm or less from a plane of a surface of the wafer (e.g., within about 0.5 mm or less, within about 0.3 mm or less, within about 0.1 mm or less).

The interferometry system can further include an electronic controller configured to determine information about a location of the stage within the lithography tool when the alignment feature is identified. The interferometry system can identify the alignment feature when the alignment feature is at a location where an optical path length difference between the two beam paths is about zero. The common light source can have a coherence length of about 1 cm or less (e.g., about 0.5 cm or less, about 0.1 cm or less, about 0.01 cm or less). The common light source can be a broadband light source (e.g., an arc lamp). The paths of the two beams can each have a component parallel to the surface associated with the stage. Alternatively, or additionally, The paths of the two beams can each have a component normal to the surface associated with the stage. The interferometer can include one or more focusing elements that focus the two beams to respective waists. The alignment feature can be identified when the alignment feature is located at the respective beam waists. In some embodiments, the interferometer is a Michelson interferometer. The interferometer can have a numerical aperture for both of the two beams of about 0.1 or less (e.g., about 0.08 or less, about 0.05 or less, about 0.03 or less, about 0.01 or less). The interferometer can include a beam splitter configured to split an input beam originating from the light source into the two beams. The beam splitter can include a beam splitting interface and the beam splitter is physically symmetric with respect to the interface. The interferometry system can also include a detector in communication with the electronic controller, the detector being configured to monitor the intensity of the output beam as the stage is moved within the lithography tool. The detector can have a maximum detection frame rate of about 1 MHz or more (e.g., about 5 MHz or more, about 10 MHz or more). The detector can include an array of detection elements or a single detection element.

The alignment feature can include a first facet and a second facet opposite the first facet. One of the two beams can reflect from the first facet and the other of the two beams reflects from the second facet when the alignment feature is identified. The first facet can be substantially orthogonal to the path of one of the two beams when the alignment is identified. The second facet can be substantially orthogonal to the path of the other of the two beams when the alignment feature is identified.

For the lithography tool wafer stage, a surface normal to the first facet and a surface normal to the second facet can each have a component along an axis along which the wafer stage is scanned or stepped within a lithography tool. The alignment feature can have a maximum width along the axis of about 1 cm or less (e.g., about 0.5 cm or less, about 0.1 cm or less, about 0.01 cm or less). The alignment feature can include a V-shaped pit or groove, or a pyramidal pit or groove in the surface. In some embodiments, the lithography tool wafer stage can further include one or more additional alignment features on a surface associated with the stage.

Embodiments of the invention include any of the following advantages.

Embodiments include methods and apparatus for locating alignment features on a wafer, wafer chuck, and/or wafer stage in a lithography tool. The methods and apparatus utilize interferometric methods, and locate alignment features to interferometric accuracy. The methods and apparatus can reduce the time of alignment procedures of wafers in lithography tools. For example, the methods and apparatus can reduce the time of alignment procedures at the exposure and load/unload stage locations in multiple stage lithography tools where either loaded wafer chucks are exchanged or the multiple stages loaded with wafers are exchanged between the exposure and load/unload stage locations.

The methods and apparatus can be used to calibrate components of metrology systems used to monitor the position of a stage in a lithography tool. For example, the methods and apparatus may be used in an alignment and calibration procedure to determine the angle between nominally orthogonal stage mirrors and of non-linear non-cyclic errors in the metrology systems of the exposure and load/unload locations of a multiple stage lithography tool.

Embodiments can provide a reduction in time required for executing alignment procedures with an improved accuracy for registration of an exchanged loaded wafer chuck at the exposure station of a multiple stage lithography tool relative to the corresponding stage, i.e., the corresponding metrology system and accordingly to the exposure lens prior to exposure of the wafer.

Embodiments can provide a reduction in time required for executing alignment procedures with an improved accuracy for registration of a newly loaded wafer relative to the corresponding wafer chuck at the load/unload location of a multiple stage lithography tool.

Alignment systems can be provided that have reduced (e.g., zero) Abbe offsets for rapid, high accuracy determination of positions of artifacts without using through the exposure lens measurements to determine the positions of the artifacts. Abbe offsets can be reduced for measurements along three orthogonal axes.

Unless otherwise defined, all technical and scientific terms used herein have the same meaning as commonly understood by one of ordinary skill in the art to which this invention belongs.

Other features and advantages of the invention will be apparent from the following detailed description.

BRIEF DESCRIPTION OF THE DRAWINGS

Like reference symbols in the various drawings indicate like elements.

DETAILED DESCRIPTION

Figure 1A:
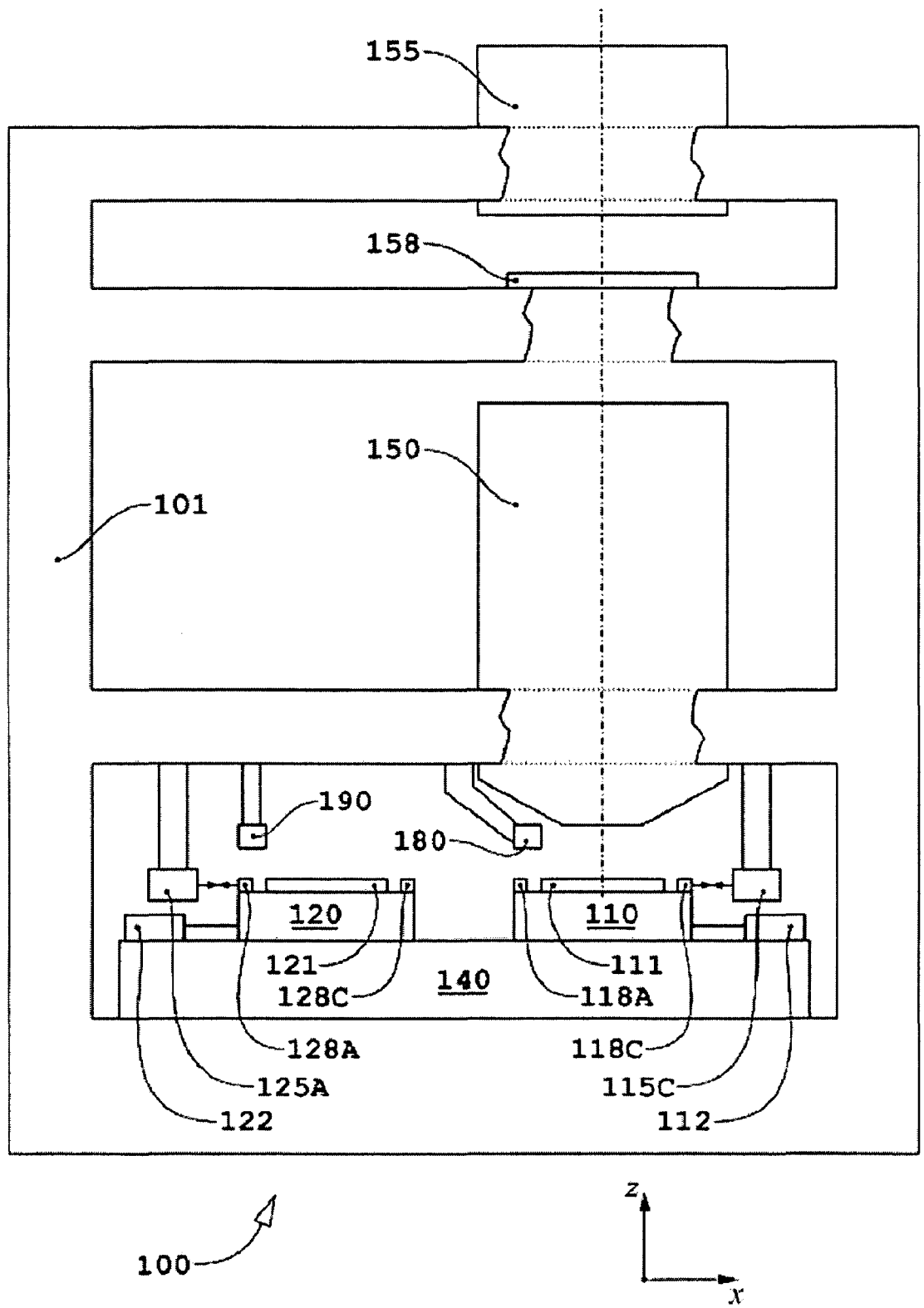
FIG. 1A is a schematic diagram of a twin stage lithography tool.
Figure 1B:
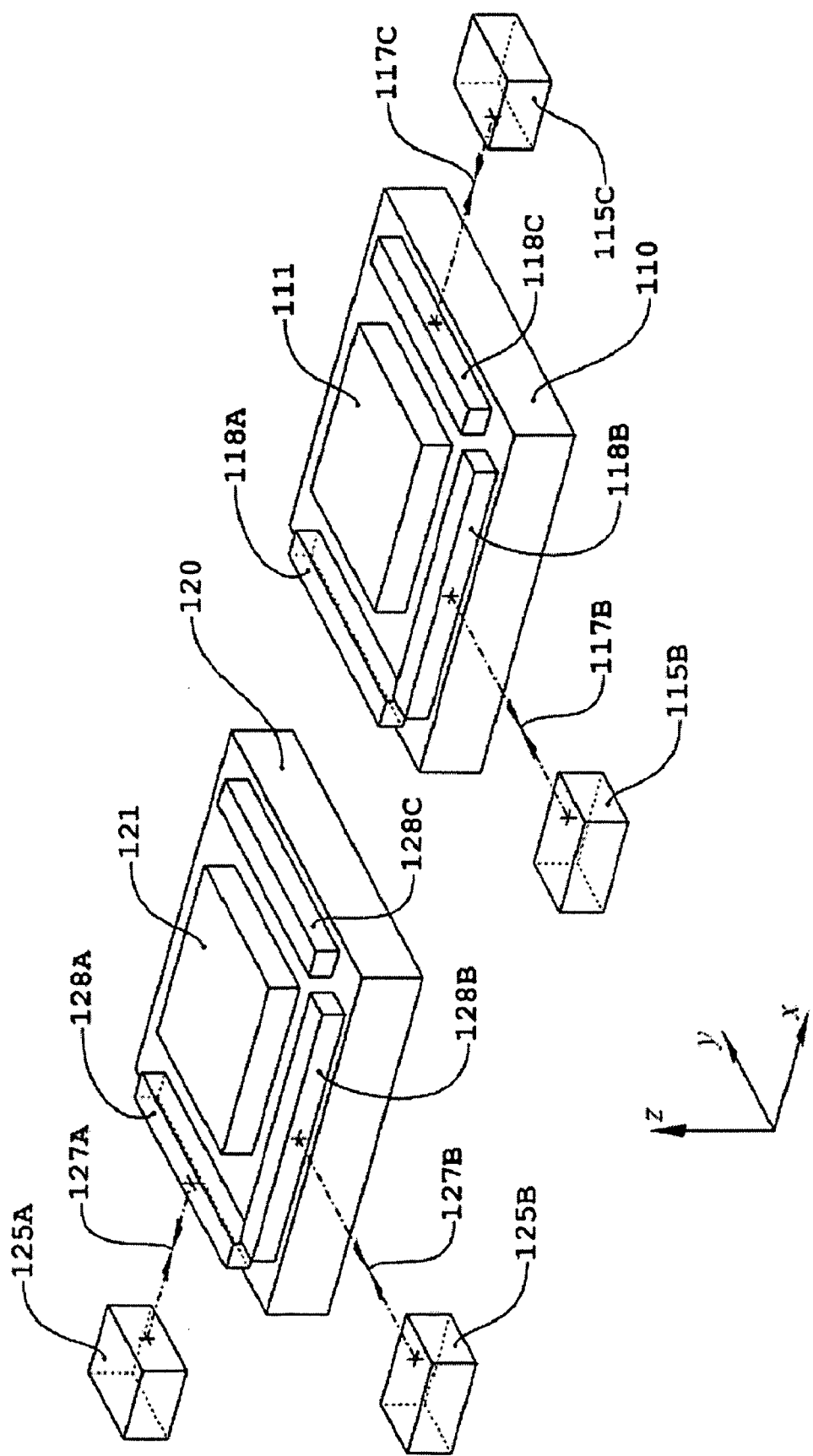
FIG. 1B is a perspective view of components in the twin stage lithography tool shown in FIG. 1A.

Referring to FIG. 1A and FIG. 1B, a twin stage lithography tool 100 includes two wafer stages, stage 110 and stage 120, located on a stage base 140 mounted on a frame 101. Stage 110 and stage 120 position and support wafer chucks 111 and 121, respectively. Stage 110 is located in an exposure position, relative to an alignment sensor 180 and an exposure lens system 150, which during operation directs radiation from a radiation source 155 to illuminate a wafer loaded in wafer chuck 111. During exposure of the wafer loaded in wafer chuck 111, a radiation beam from source 155 (e.g., an ultraviolet (UV) beam) passes through beam shaping optics and travels downward toward stage 110 from radiation source 155. The radiation beam passes through a mask 158 carried by a mask stage. The mask is imaged onto the wafer on wafer stage 110 via exposure lens system 150.

Stage 120 is positioned in a load/unload position, relative to an alignment sensor 190. For lithography tools where loaded wafer chucks are exchanged between exposure and load/unload locations, the position of wafer chuck 121 is located on stage 120 by locating alignment features (also referred to as alignment marks or alignment artifacts) on wafer chuck 121 and the position of a newly loaded wafer relative to wafer chuck 121 is located by locating alignment marks on both wafer chuck 121 and wafer loaded in wafer chuck 121. For lithography tools where wafer stages are exchanged between exposure and load/unload locations, the position of a newly loaded wafer in wafer chuck 121 relative to wafer stage 120 is located by locating alignment marks on the newly loaded wafer in wafer chuck 121. In the load/unload position, a wafer exchanger (not shown) removes exposed wafers and replaces them with unexposed wafers and the location of the newly loaded wafer is determined while the tool exposes the wafer in wafer chuck 111.

For lithography tools where loaded wafer chucks are exchanged between exposure and load/unload locations, a chuck exchange system (not shown in figures) exchanges chucks 111 and 121 between the exposure position and the load/unload position. For lithography tools where wafer stages are exchanged between exposure and load/unload locations, a stage exchange system including a positioning system exchanges the stage 110 and 120 between the exposure position and the load/unload position. For both of the two different modes of operation, the positioning system for stages 110 and 120 includes stage actuators 112 and 122. Stage actuators 112 moves stage 110 while actuator 122 moves stage 120. The actuators translate the stages relative to either alignment sensor 190 or alignment sensor 180 when the stage is in the load/unload position or exposure position, respectively. Alignment sensors 180 and 190 include interferometers (e.g., white light interferometers) that use alignment marks on wafer stages, wafer chucks, and/or artifact wafers that serve as both reference and measurement objects for the interferometers. With respect to the coordinate system shown in FIGS. 1A and 1B, the actuators translate the stages in the x- and y-directions, and can pivot the stages about the x-, y-, and z-axes.

The stage exchange system may exchange the stages between the load/unload and exposure positions by rotating base 140 about an axis parallel to the z-axis. Alternatively, base 140 can include conveyors that translate the stages along paths in the x- and y-directions. In such embodiments, the positioning system can exchange the stages by first displacing one of the stages in the y-direction, and then moving both stages along parallel paths in opposite directions along the x-axis. Once their positions along the x-axis have been exchanged, the stage originally displaced along the y-axis is returned to its original y-coordinate, completing the exchange.

Base 140 and the various components supported by it can be isolated from environmental vibrations by a damping system, including, for example, air bearings.

An interferometry system is used to precisely monitor the position of stages 110 and 120 within tool 100. The interferometry system includes interferometers 115B and 115C, which monitor the position and orientation of stage 110 in the exposure position, and also includes interferometers 125A and 125B which monitor the position and orientation of stage 120 in the load/unload position. Interferometers 115B and 125B monitor stage displacements in the y-direction, while interferometers 115C and 125A monitor stage displacements in the x-direction. The interferometers monitor the stage positions/orientations by directing measurement beams to reflect from plane mirror measurement objects mounted on each stage.

For lithography tools where loaded wafer chucks are exchanged between exposure and load/unload locations, two measurement objects are mounted on each stage: measurement objects 118B and 118C are mounted on stage 110; and measurement objects 128A and 128B are mounted on stage 120. For lithography tools where wafer stages are exchanged between exposure and load/unload locations, three measurement objects are mounted on each stage: measurement objects 118A, 118B, and 118C are mounted on stage 110; and measurement objects 128A, 128B, and 128C are mounted on stage 120. Measurement objects 118B and 118C reflect measurement beams 117B and 117C to interferometers 115B and 115C, respectively. Similarly, measurement objects 128A and 128B reflect measurement beams 127A and 127B to interferometers 125A and 125B, respectively Another positioning system positions mask 158 relative to radiation source 155 and exposure lens system 150. The positioning system can include, e.g., piezoelectric transducer elements and corresponding control electronics. Lithography tool 100 can also include an interferometry systems to monitor the position of the mask stage as well as other moveable elements whose position must be accurately monitored in processes for fabricating lithographic structures (see supra Sheats and Smith *Microlithography: Science and Technology*).

An electronic controller (e.g., a computer) is in communication with various components of tool 100 (e.g., with radiation source 155, lens system 150, alignment sensors 180 and 190, and interferometers 115B, 115C, 125A, and 125B) and co-ordinates the placement, exposure, and removal of wafers in the system. The electronic controller can include a user interface through which an operator can provide information and initiate various tool procedures.

In other embodiments of lithographic tool 100, the interferometry system can be used to measure distance along multiple axes and angles associated for example with, but not limited to, the mask (or reticle) stages. Also, rather than a UV laser beam, other beams can be used to expose the wafer including, e.g., x-ray beams, electron beams, ion beams, and visible optical beams.

In some embodiments, the lithography scanner can include what is known in the art as a column reference. In such embodiments, one or more of the interferometers direct a reference beam along an external reference path that contacts a reference mirror mounted on some structure that directs the radiation beam, e.g., a lens system 150. The reference mirror reflects the reference beam back to the interferometer. The interference signal produce by the interferometer when combining the measurement beam reflected from the measurement object on stage 110 and the reference beam reflected from a reference mirror mounted on the lens housing indicates changes in the position of the stage relative to the radiation beam. Furthermore, in other embodiments the interferometry system can be positioned to measure changes in the position of reticle (or mask) stage or other movable components of lithography tool 100. Finally, the interferometry systems can be used in a similar fashion with lithography systems involving steppers, in addition to, or rather than, scanners.

Examples of twin stage lithography systems are also described in commonly owned U.S. patent application Ser. No. 10/411,890 entitled "Interferometry System Error Compensation In Twin Stage Lithography Tools" to Henry A. Hill filed on Apr. 11, 2003 the contents of which are incorporated herein by reference.

Figure 2:
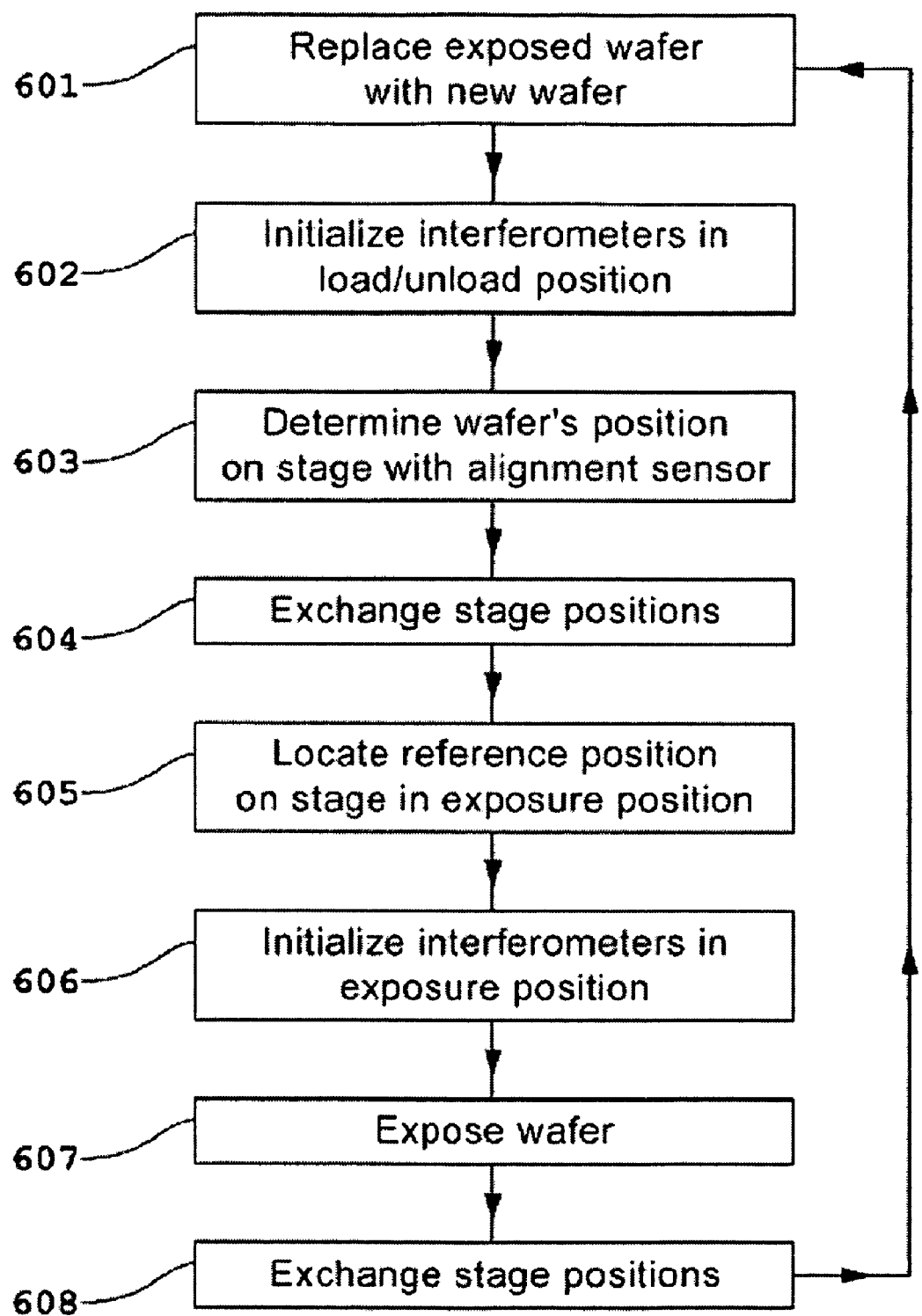
FIG. 2 is a flow chart showing the operation of the twin stage lithography tool.

Turning now to the operation of lithography tool 100, initially, operation is described briefly for a single wafer, followed by a more detailed description of various process steps. Lithography tool operation is summarized in a flow chart 600, shown in FIG. 2.

First, an exposed wafer is removed from stage 120 in the load/unload position, and a wafer exchanger places an unexposed wafer in its place (step 601). Tool 100 then initializes interferometers 125A and 125B (step 602) determines the location and orientation of the wafer on stage 120 using alignment sensor 180 and interferometers 125A and 125B (step 603). Tool 100 then exchanges the positions of stage 110 and stage 120, so that stage 120 is in the exposure position and stage 110 is in the load/unload position (step 604). Once stage 120 is in the exposure position, the tool locates a reference positions (e.g., corresponding to alignment marks) on the stage (step 605) and initializes interferometers 115B and 11SC (step 606), and then positions the wafer relative to exposure apparatus 150. Tool 100 then proceeds to expose the wafer (step 607). Once the exposure is complete, tool 100 again exchanges the stages, moving stage 120 back to the load/unload position and stage 110 to the exposure position (step 608), and the procedure repeats.

Returning to the first step, step 601, when placed on stage 120, the location and orientation of the wafer on the stage is not always known to sufficient accuracy for the purposes of exposure. Although the wafer can be aligned when in the exposure position, the time taken aligning the wafer in the exposure position can slow down the exposure cycle and reduce wafer throughput. Thus, an alignment step is performed while the wafer is in the load/unload position and the information determined during this alignment is used to reduce alignment time in the exposure position.

The purpose of the alignment step is to determine the position and orientation of the wafer with respect to the stage. During alignment, tool 100 initializes interferometers 125A and 125B if stages are exchanged in order to register the stage to a reference frame shared by the interferometers. Subsequent movement of the stage within the reference frame is monitored to interferometric accuracy by the interferometers.

Initialization involves moving the stage to a known reference position in the load/unload position. The point at which the stage reaches the reference position is determined by locating the alignment marks on the stage. The reference position can correspond to a stage location in which a distance between interferometer 125A and measurement object 128A, and a distance between interferometer 125B and measurement object 128B are relatively small compared to the range of motion of the stage in the load/unload position. For example, in the reference position, these measurement objects can be less than about five centimeters from their respective interferometers.

Once the stage is in the reference position, an electronic controller initializes the system by noting a heterodyne interference phase of each signal received from interferometers 125A and 125B. Subsequent changes in these phases are used by the controller to track the location of the measurement objects, and correspondingly, the location of the stage and wafer with respect to the reference position.

After initialization, the location of the stage with respect to a reference frame is known, however, the location of the wafer on the stage is not. To determine the location of the wafer on the stage, the stage actuators scan the stage position until the wafer is located by alignment sensor 190. The location of alignment sensor 190 with respect to the reference frame is known from the system design and calibration. During this scanning, interferometers 125A and 125B monitor the location of the stage. The interferometer measurements can be compensated for systematic errors using data acquired for the system in the current configuration, improving the accuracy of the interferometer measurements. The stage scans the wafer's position until a sufficient number of alignment marks are identified to unequivocally determine the wafer's location and orientation on the stage. Electronic controller retains this information for use in aligning the wafer during exposure.

Once tool 100 has determined the wafer's location, and once the exposure cycle for the wafer on stage 110 is complete, tool 100 exchanges the stage positions, moving stage 120 and respective wafer to the exposure position. At this stage, although the location and orientation of the wafer on stage 120 are known, the location of the stage relative to lens system 150 is not known when stages are exchanged or the location of a wafer chuck relative to a wafer stage is not known when loaded wafer chucks are exchanged.

The position of stage 120 with respect to lens system 150 can be determined by moving the stage to a reference position. The reference position is identified by locating three or more alignment marks in the stage or the wafer chuck as appropriate. Once the reference position has been identified, tool 100 initializes interferometers 115B and 115C so that the tool can precisely position the wafer with respect to lens system 150, and can monitor the wafer's position during the exposure scan. When the wafer stages are exchanged, interferometer measurements can be compensated for systematic errors using previously acquired data corresponding to stage 120 in the exposure position. Due to the accuracy improvement provided by error compensation, initial wafer alignment with respect to lens system 150 can be performed to sufficient accuracy by locating fewer alignment marks than may be necessary in comparable systems that do not employ the error compensation.

The exposure proceeds by exposing the wafer to the exposure radiation while scanning the wafer's position so that different portions of the wafer, e.g., corresponding to individual microchips or portions of individual microchips, are exposed. During the scanning, the tool monitors the wafers location using interferometers 115B and 115C, again compensating the interferometer measurements for systematic errors. Once the exposure is complete, stage 120 is returned to the load/unload position and the exposed respective wafer is replaced with a new wafer.

As discussed previously, in some embodiments, alignment sensors 180 and/or 190 include white light interferometers. In such embodiments, the alignment marks can include facets that serve respectively as the measurement and reference surfaces for the interferometer. An example of a white light interferometer is shown schematically in FIG. 3A as a Michelson interferometer 200. Interferometer 200 includes a broadband light source 210, interferometer optics such as a beam-splitter interface 220 for defining reference and measurement paths to reference and measurement reflective surfaces 230 and 240, respectively, of an object 250, a detector 260, and an electronic processor 290 coupled to detector 260. Detector 260 may include one or more pixels depending on whether one or more locations of reflective surfaces 230 and 240 are to be examined simultaneously. In some embodiments, detector 260 is a relatively high-speed detector. For example, detector 260 can have sampling rate of about 1 MHz or more (e.g., about 5 MHz or more, about 10 MHz or more).

The effect of ghost beams can be reduced by placing a mask at detector 260 with one or more apertures that are conjugate to an aperture at the source 210, i.e., configured to function as a confocal imaging system.

Broadband source 210 generates diverging beam 232 which is collimated by lens 212 as collimated beam 246. Collimated beam 246 is incident on beam-splitter 220 and a portion thereof is transmitted as reference beam 236. A second portion of collimated beam 246 is reflected to form measurement beam 234. Reference beam 236 is reflected by mirror 222 and focused by lens 214 to form the outgoing converging component of reference beam 242. Outgoing converging component of reference beam 242 is focused to a spot on virtual reference surface 230R. Measurement beam 234 is reflected by mirror 224 and focused by lens 216 to form the outgoing converging component of measurement beam 238. Outgoing converging component of measurement beam 238 is focused to a spot on virtual measurement surface 240R. Next, outgoing converging components of reference and measurement beams 238 and 242, respectively, are reflected by reflective surfaces 230 and 240, respectively, to form return diverging components of reference and measurement beam 242 and 238, respectively. In some embodiments, the numerical aperture of interferometer 200 for the measurement and reference beams is relatively low (e.g., about 0.1 or less, about 0.08 or less, about 0.05 or less, about 0.03 or less). As an example, lenses 214 and 216 can have a numerical aperture of about 0.03 with a diffraction limited spot sizes at surfaces 230R and 240R of approximately 10μ in the visible and a corresponding non-limiting example for the width of the artifact corresponding to surfaces 230 and 240 is 40μ.

In certain embodiments, beam-splitter interface 220 is a symmetric structure with respect to the center line of the interface. Interface 220 is located symmetrically between plane parallel plates 270 and 272 to form a monolithic structure. The thicknesses of plates 270 and 272 are the same and selected such that ghost beams generated by reflection of reference and measurement beams at facets of plates 270 and 272 do not overlap beams 236, 234, or the output beam 244 (see FIG. 3A) so that the effects of the ghost beams can be eliminated by stops (not shown in a figure) placed in interferometer 200. If the effects of the ghost beams are not eliminated, the ghost beams can introduce phase shifts in the electrical interference signal generated by detector 260 analogous to the generation of cyclic errors in interferometer systems using heterodyne detection. The entrance and exit facets of plates 270 and 272 can be coated with antireflection coatings. In such embodiments, the two coatings can be fabricated to maintain the symmetry between the reference and measurement paths of interferometer 200.

The thicknesses of plates 270 and 272 can also be fabricated to be the same. This can reduce the generation of relative phase shift effects of changes in temperature of plates 270 and 272 and can reduce the relative phase shift effects due to dispersion of the media of plates 270 and 272 that are present in white light interferometers [for further description, see, e.g., the subsequent description associated with Eq. (3)].

Beam-splitter interface 220 can be fabricated as a symmetric structure located symmetrically between plates 270 and 272. The symmetric construction can reduce effects that would otherwise affect the location of the maximum in the envelope of the electrical interference signal and the location of the central peak of the electrical interference signal [for further description, see, e.g., the subsequent description associated with Eq. (3)].

In addition, the optical thicknesses of lenses 214 and 216 can be fabricated to be the same, which can reduce the phase shift effects of changes in temperature of lenses 214 and 216 and to eliminate the relative phase shift effects due to dispersion of the media of lenses 214 and 216 [for further description, see, e.g., the subsequent description associated with Eq. (3)]. The effects of dispersion of the media and of changes of indices of refraction with temperature in lenses 214 and 216 can be eliminated by fabricating lenses 214 and 216 as catoptric systems such as the Schwarzschild telephoto type objective described in Chapter 14, Section V, Subsection C of the book entitled "Lens Design Fundamentals" by R. Kingslake (Academic Press, 1978) of which the contents are herein incorporated in its entirety by reference.

Interferometer 200 is arranged to measure a displacement in the x-direction of a line 252 formed by the intersection of reflective surfaces 230 and 240 using interference phase information. Reflective surfaces 230 and 240 are opposite facets of either a V-groove or pyramidal pit. The virtual plane 254 in the y-z plane is defined by interferometer 200 by the intersection of conjugate surfaces 230R and 240R and is the datum to which all displacements in the x-direction and interference phase measurements are referenced. The location of the datum is $\Xi$ with respect to a coordinate system of a respective stage metrology system (see FIG. 3A and the discussion of Eq. (4)). Surfaces 230R and 240R are parallel to reflective surfaces 230 and 240, respectively. To first order in the wavenumber $k=2\pi/\lambda$, the interference phase $\phi$ with respect to virtual plane 254 is $$\varphi(k, \xi) = \qquad (1)$$
$$4nk \cos\alpha(\xi - \Xi) + (\gamma_{art} + \gamma_{sys}) + (\tau_{art} + \tau_{sys})(k - k_0),$$

where $$\alpha = \left[\tan^{-1}\left(\frac{1}{\sqrt{2}}\right)\right], \qquad (2)$$

$\lambda$ is the wavelength, $k_0$ is the nominal wavenumber (e.g., corresponding to the average wavelength of the light source), $\xi$ is the location in the x-direction of line 252, $\gamma_{art}$ is the difference in surface phase change on reflection (PCOR) in the artifact formed by surfaces 230 and 240, and $\gamma_{sys}$ is the system phase offset attributable to the interferometer system. The parameter $\gamma_{sys}$ includes PCOR contributions from the interferometer optics and any constant offsets. The linear dispersion coefficients $\tau_{art}$ and $\tau_{sys}$ correspond to the phase offsets $\gamma_{art}$ and $\gamma_{sys}$, respectively. The phase offsets $\gamma_{art}$ and $\gamma_{sys}$ are evaluated at the nominal wavenumber $k_0$. The parameters $\gamma_{art}$ and $\tau_{art}$ are retained in the subsequent description for purposes of completeness although the effect of $\gamma_{art}$ and $\tau_{art}$ can be, to a sufficiently high level of accuracy, equal to zero or at least negligible. For example, where the reflective properties of reference and measurement surfaces 230 and 240 are to a high level of accuracy identical, the effects of $\gamma_{art}$ and $\tau_{art}$ can, in general, be ignored. The index of refraction n is for air and is assumed to be independent of wavenumber. However, in embodiments where media optically more dense than air is used, the foregoing teachings can be adapted by taking into account the wavenumber dependence of material index.

In scanning interferometric measurements, light source 210 provides broadband radiation so that interference fringes are only produced when the optical path difference between the reference and measurement legs are nominally within the coherence length of the broadband radiation. The coherence length of light source 210 can be relatively short. For example, the coherence length can be about 1 mm or less (e.g., about 0.1 mm or less, about 0.05 mm or less, about 0.03 mm or less, about 0.01 mm or less). Thus, scanning interferometric measurements in the x-direction uses the broadband nature of the interference effect, e.g., the localization of fringe contrast or equivalently, the measurement of the rate of change of interference phase with wavenumber such as described in commonly owned U.S. Pat. No. 5,398,113 entitled "METHOD AND APPARATUS FOR SURFACE TOPOGRAPHY MEASUREMENT BY SPATIAL-FREQUENCY ANALYSIS OF INTERFEROGRAMS" to Peter de Groot; U.S. Pat. No. 6,597,460 B2 entitled "HEIGHT SCANNING INTERFEROMETER FOR DETERMINING THE ABSOLUTE POSITION AND SURFACE PROFILE OF AN OBJECT WITH RESPECT TO A DATUM" to P. de Groot, X. C. de Lega, L. L. Deck, and J. W. Kramer; and U.S. patent application Ser. No. 09/769,859 entitled "OPTICAL SYSTEMS FOR MEASURING FORM AND GEOMETRIC DIMENSIONS OF PRECISION ENGINEERED PARTS" and in the articles entitled "Optical Interferometry For Measuring The Geometric Dimensions Of Industrial Parts" by P. de Groot, J. Biegen, J. Clark, X. C. de Lega, and D. Grigg, Applied Optics 41(19), p. 3853 (2002) and "Determination Of Fringe Order In White Light Interference Microscopy" by P. de Groot, X. C. de Lega, J Kramer, and M. Turzhitsky, Applied Optics 41(22), p. 4571 (2002) for which the contents of both patents, the provisional patent application, and the two articles are herein included in their entirety by reference.

Object 250 is scanned in the x-direction by translating the wafer stage to which it is attached and the electrical interference signal generated by detector 260 is transmitted as signal 262 to electronic processor 290 for subsequent processing. According to Eq. (1), the overlapping interference fringes for the various emissions of broadband source 210 result in a normalized electrical interference signal I given by $$I(\xi) = 1 + V\left[\cos\alpha(\xi - \Xi) + \frac{(\tau_{art} - \tau_{sys})}{4n}\right] \quad (3)$$
$$\cos[4nk_0\cos\alpha(\xi - \Xi) + (\gamma_{art} + \gamma_{sys})]$$

where V is the fringe contrast envelope. The envelope V is proportional to the Fourier transform of the spectral distribution of the light detected by detector 260 including the effect of the spectral sensitivity of detector 260.

For a symmetric contrast envelope, the peak value of the fringe contrast envelope is given by the scan position for which $d\phi/dk=0$. This is the stationary phase position, where the interference phase is the same independent of wavenumber, and all of the interference patterns add up constructively. More generally, it can be shown that the stationary phase condition $d\phi/dk=0$ corresponds to the centroid of the fringe contrast envelope V.

From Eq. (3), it can be seen that the maximum or peak fringe contrast occurs at the scan position $\xi=\Xi-(\tau_{art}+\tau_{sys})/(4n\cos\alpha)$. Thus, in some embodiments, the system determines the fringe-contrast envelope V as a function of $\xi$, e.g., by electronic or digital conversion, for each pixel of detector 260. It then determines the scan position $\xi_{max}$ for which the envelope V reaches a specific value, e.g., its maximum or peak value. The corresponding position $\Xi$ of line 252 is the scan position $\xi_{max}$ plus the dispersion offset:

$$\Xi = \xi_{max} + \frac{(\tau_{art} + \tau_{sys})}{4n}\sec\alpha. \quad (4)$$

Components of interferometer 200 can be fabricated to maintain symmetry between the reference and measurement paths as described above so that the dispersion offset $(\tau_{art}+\tau_{sys})/(4n\cos\alpha)$ is nominally zero. As a result of the role of interferometer 200 in determining the position of the corresponding line 252 from wafer chuck to wafer chuck when wafer chucks are exchanged or from wafer stage to wafer stage when wafer stages are exchanged, the absolute position is not, in general, the critical parameter as long as the effect of changes of the dispersion offset with changes in temperature and time are negligible in the system's end use application. Accordingly, it is not generally necessary to compensate for the effects of the dispersion offset and $\xi_{max}$ can be used directly for registering the position of line 252. Thus, in certain embodiments, interferometer 200 should be fabricated so that the effect of changes of the dispersion offset with changes in temperature and time are negligible in its end use application.

In some embodiments, the electrical interference signal is Fourier transformed with respect to the scan position $\xi$ into the frequency domain (i.e., to frequency wavenumber k). The phase of the transformed data corresponds directly to the phase $\phi(k)$ in Eq. (1). From this phase, signal processor 290 calculates the phase derivative $d\phi/dk$, and determines the position $\xi$ for the one or more pixels of detector 260 according to:

$$\xi = \left[\left(\frac{d\varphi}{dk}\right)_{\Xi=0} - (\tau_{art} + \tau_{sys})_{k_0}\right]\left(\frac{\sec\alpha}{4n}\right) \quad (5)$$

where the derivative $(d\phi/dk)_{\Xi=0}$ is calculated for $\Xi=0$. Eq. (5) follows directly from Eq. (1).

In certain embodiments, a value of $\xi$ for which the phase $\phi=(2p+1)\pi/2$ where p is an integer or the average of two or more values of $\xi$ for which phase $\phi=(2p+1)\pi/2$ is used directly for registering the position of line 252. The values of $\xi$ for which phase $\phi=(2p+1)\pi/2$ where p is an integer may be determined as those values of $\xi$ for which $I(\xi)=0$. The phase information used to determine values of $\xi$ for which phase $\phi=(2p+1)\pi/2$ where p is an integer may be obtained from a Fourier transform of the electrical interference signal. Information obtained from the measured properties of the fringe contrast envelope V can be used in the algorithm to remove phase redundancy represented by the integer p in measured values of phase for which $\phi=(2p+1)\pi/2$. The algorithm can be used where the locations for which the phase $\phi=(2p+1)\pi/2$ where p is an integer relative to $\Xi$ are stable to a sufficient accuracy in the end use application with respect to changes in temperature and time including the effects of changes of the spectral distribution of source 210. More specifically, the absolute position of line 252 is not, in general, a critical parameter to be measured when determining the position of the corresponding line 252 from wafer chuck to wafer chuck when wafer chucks are exchanged or from wafer stage to wafer stage when wafer stages are exchanged.

Long term and short term stability of the interferometer 200 with respect to the use of interferometer 200 when determining line 252 is also dependent on the long term and short term stability of the relative locations of mirrors 222 and 224 and beam-splitter elements 270 and 272 with respect to each other. To meet the long term and short term stability requirements, the cited elements can be mounted to a frame that includes, for example, Ultra Low Expansion (ULE) in a monolithic structure. Another consideration in this respect is mounting of interferometer 200. In some embodiments, interferometer 200 is mounted by using a mounting similar to that which the interferometers of the metrology system of the lithography tool are mounted to maintain long term and short term stability of the location and orientation of interferometer 200 relative to the metrology system of the lithography tool.

The measured location in the x-direction of an artifact can be insensitive to changes in the height of object 250. Moreover, the location of line 252 can be measured at a relatively high speed and to relatively high accuracy. For example, e.g., a position measurement to an accuracy of about 0.5 nm or less (e.g., about 0.3 nm or less, about 0.1 nm) can be measured in a time period of about 100 ms or less (e.g., about 50 ms or less, about 30 ms or less).

In addition to described use of white light interferometers, the position of line 252 can also be based on interferometric phase profiling data where the interferometric phase $\phi(k)$ is measured for one or more wavenumbers such as described in cited U.S. Pat. No. 6,597,460 B2.

In height profilers such as described in cited U.S. Pat. Nos. 5,398,113 and 6,597,460 B2, in cited U.S. patent application Ser. No. 09/769,859 entitled "OPTICAL SYSTEMS FOR MEASURING FORM AND GEOMETRIC DIMENSIONS OF PRECISION ENGINEERED PARTS" and in the cited articles entitled "Optical Interferometry For Measuring The Geometric Dimensions Of Industrial Parts" and "Determination Of Fringe Order In White Light Interference Microscopy", the analog of line 254 is scanned instead of scanning the substrate as described above. In some embodiments, mirrors 222 and 224 Interferometer 200 can be mounted on transducers such as transducers 222T and 224T shown schematically in FIG. 3B in order to generate a corresponding scan of line 254. The properties of the transducers can be monitored as a function of time and corrections made accordingly in order achieve the long performance required in an end use application.

Although the foregoing discussion is with regard to locating the position of an artifact along a single axis, in some embodiments, an alignment sensor can be used to locate the position of an artifact in two orthogonal axes. For example, an alignment sensor can include a two degree of freedom interferometer system including two white light interferometers. In certain embodiments, one of the two white light interferometers can be the same as white light interferometer 200 described above. This white light interferometer is used to locate the position of a pyramidal pit defined by side walls 230 and 240 in the x-direction. Referring to FIG. 3C, the interferometry system also includes a second white light interferometer 200S, which is used to locate the position of the pyramidal pit defined by side walls 230S and 240S in the y-direction. Elements of the second white light interferometer 200S and elements of white light interferometer 200 shown with alphanumeric numbers and numbers, respectively, that differ by a suffix S perform the same functions. The plane of FIG. 3C is orthogonal to the plane of FIG. 3A.

The beam-splitter of interferometer 200S, including plates 270S and 272S, can be located adjacent to and below the beam-splitter of interferometer 200 comprising plates 270 and 272. The beam splitter interfaces 220 and 220S of the beam-splitters of interferometers 200 and 200S are orthogonal to each other. The effect of the downward displacement of the beam-splitter in interferometer 200S can be compensated by mirrors 222A and 222B for the reference beam and mirrors 224A and 224B for the measurement beam. To meet the long term and short term stability requirements, the mirrors and beam-splitters of interferometers 200 and 200S can be mounted to a frame that includes, for example, ULE in a monolithic structure.

Figure 3A:
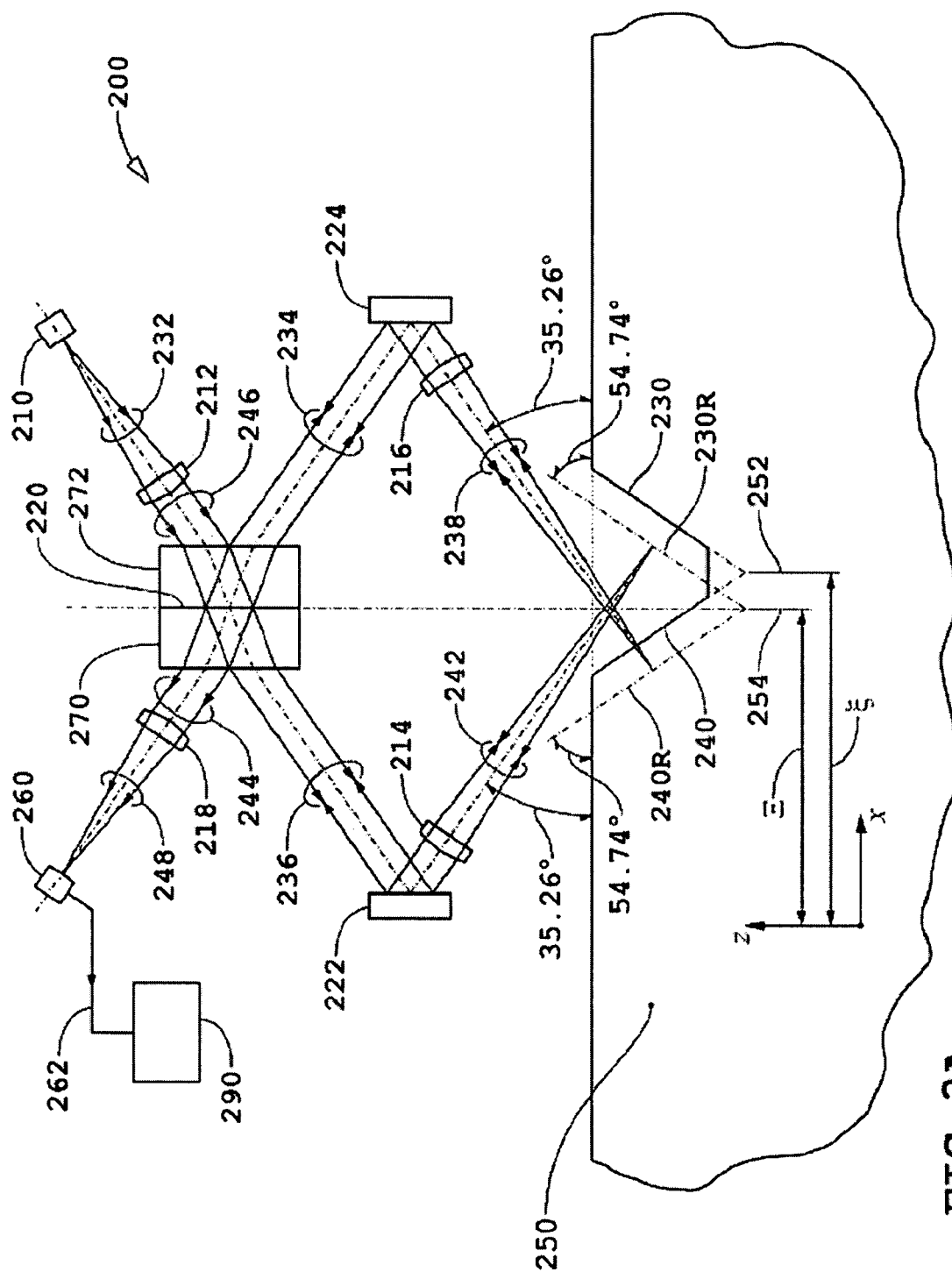
FIG. 3A is a schematic diagram of a single axis white light interferometer.
Figure 3B:
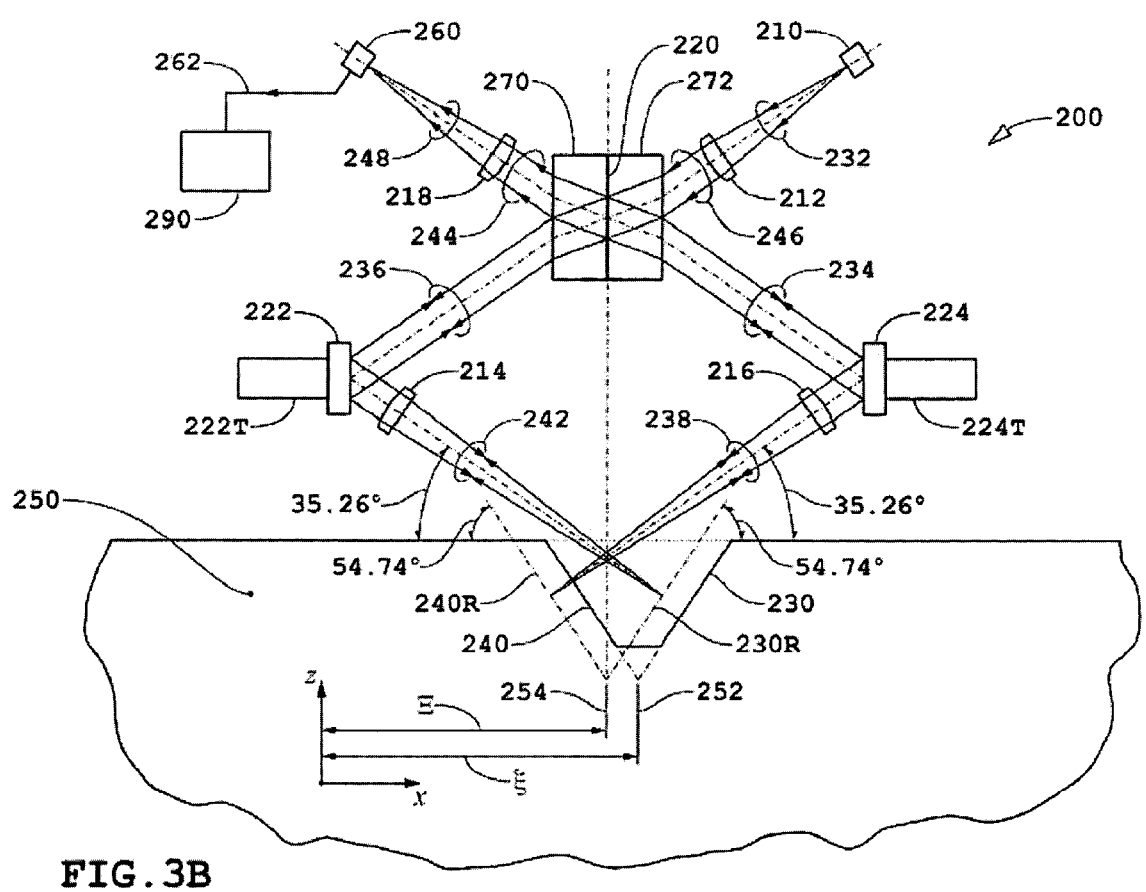
FIG. 3B is a schematic diagram of a single axis white light interferometer with transducers.
Figure 3C:
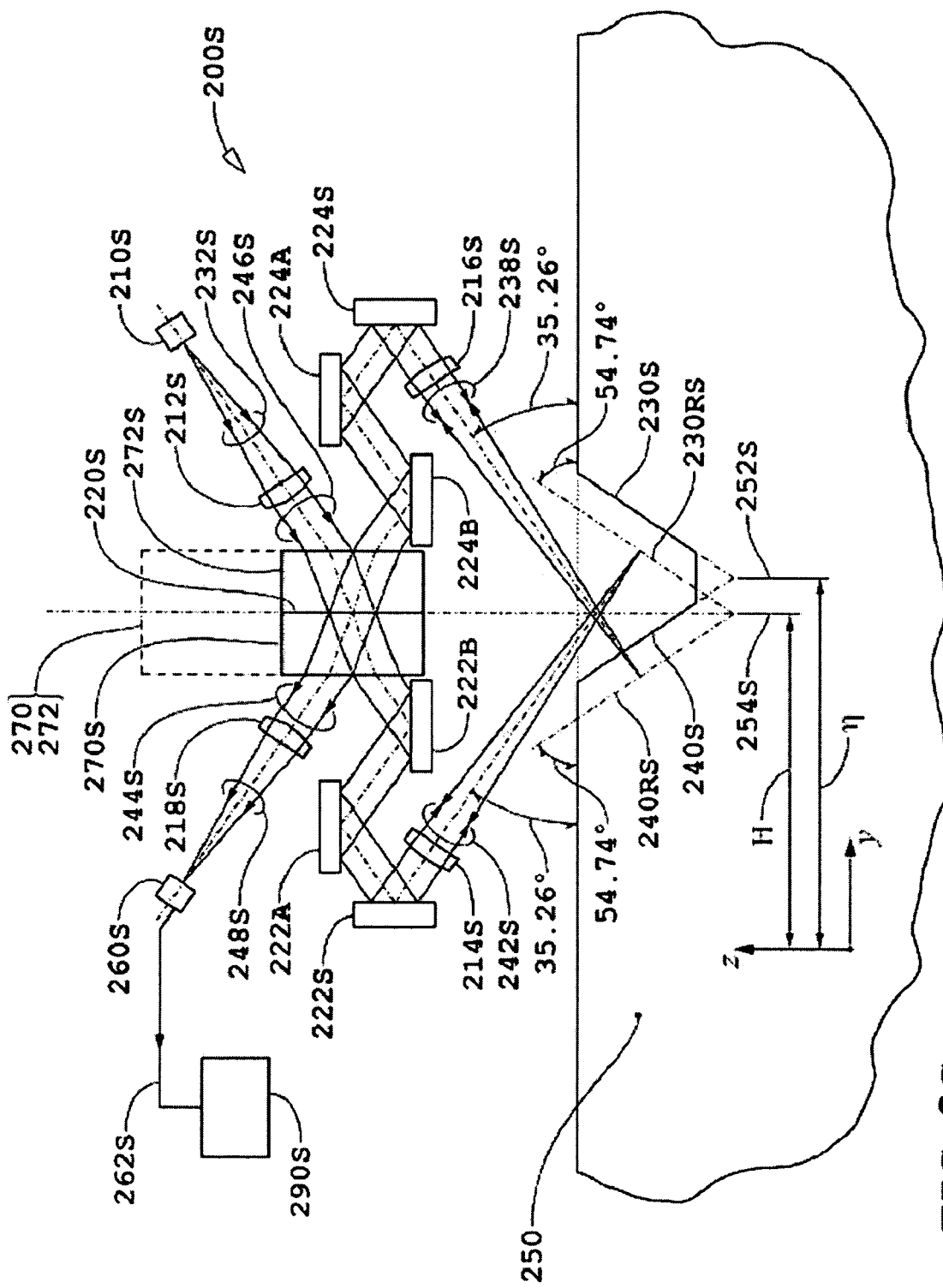
FIG. 3C is a schematic diagram of a second axis of a two degree of freedom white light interferometer system.

The parameters H and η shown in FIG. 3C for interferometer 200S correspond to the parameters Ξ and ξ shown in FIG. 3A for interferometer 200. Interferometer 200S operates in that same way as interferometer 200, as described above.

While interferometers 200 and 200S are Michelson interferometers, in general, white light interferometers can take other forms. For example, white light interferometers can include a high stability plane mirror interferometer (HSPMI) as well as other interferometers such as described in an article entitled "Differential interferometer arrangements for distance and angle measurements: Principles, advantages and applications" by C. Zanoni, VDI Berichte Nr. 749, 93-106 (1989) of which the contents are herein incorporated in its entirety by reference.

Figure 4A:
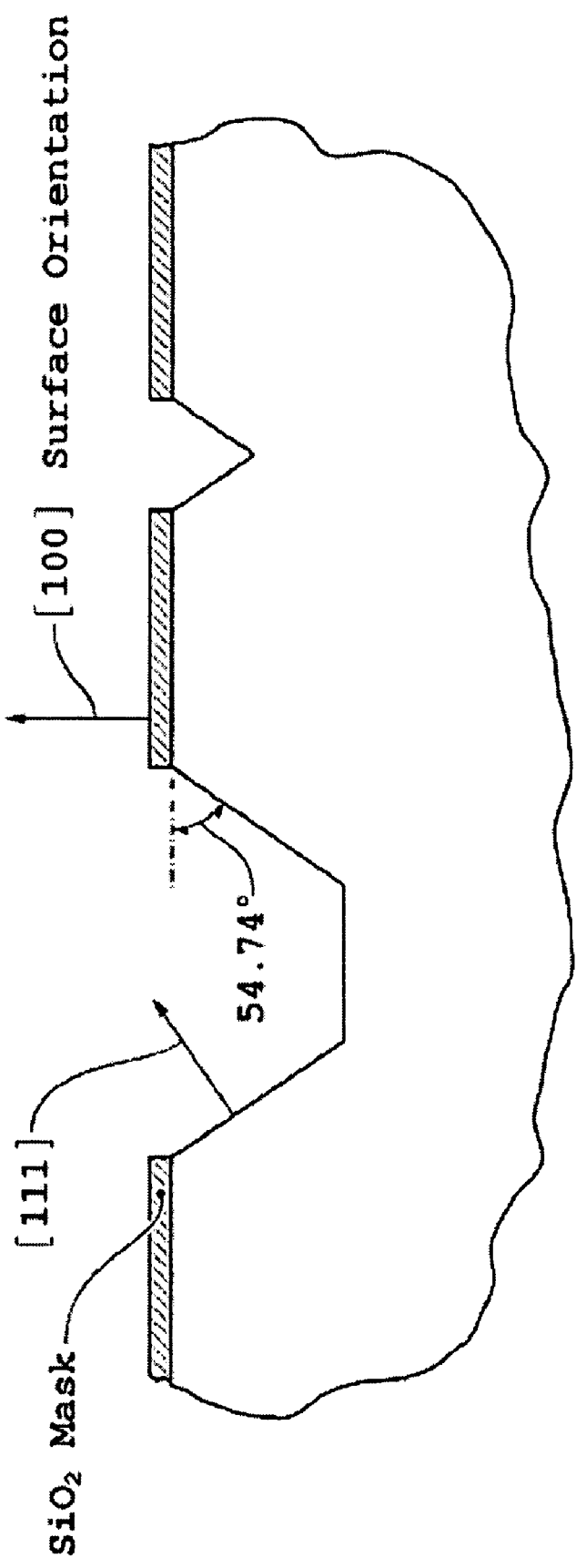
FIG. 4A is a schematic diagram showing properties of V-groove and pyramidal pits in [100] SCS.
Figure 4C:
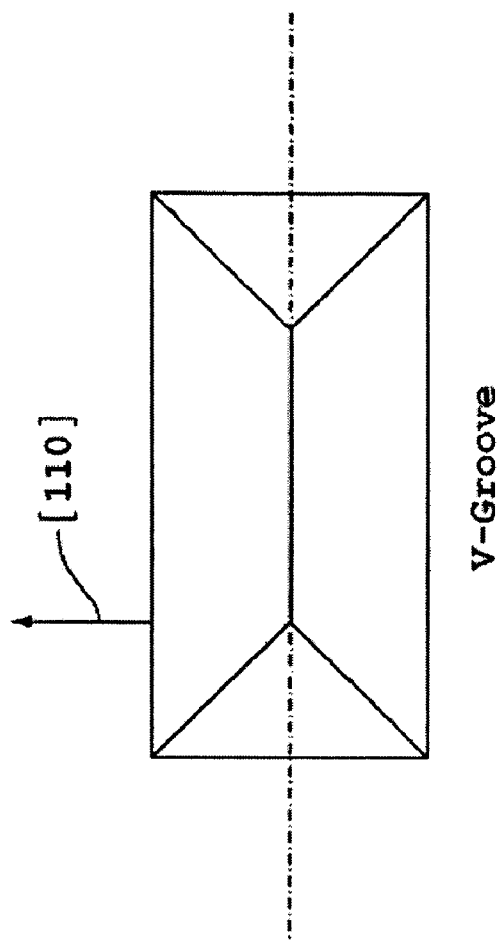
FIG. 4C is a top view of a V-groove in [100] SCS.
Figure 4B:
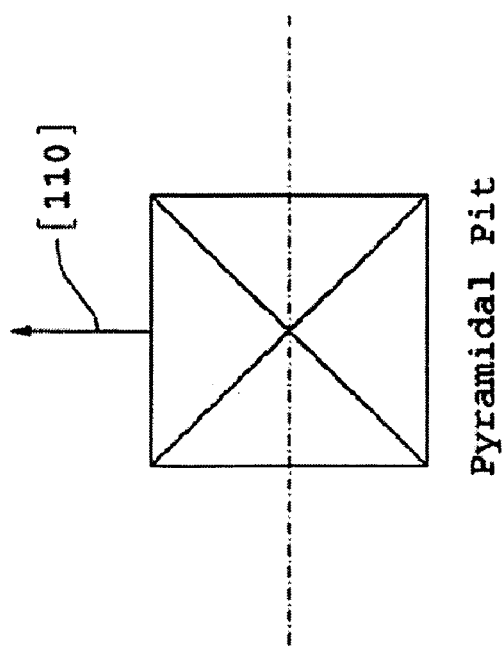
FIG. 4B is a top view of a pyramidal pit in [100] SCS.

In general, the size, shape, and composition of the alignment marks can vary. In some embodiments, V-grooves and/or pyramidal pits are fabricated from a subassembly of optical flats, generated by anisotropically etching single crystal Si (SCS). Alternatively, or additionally, the alignment marks can be formed by replication of V-grooves and/or pyramidal pits etched in SCS. For generation of V-grooves and/or pyramidal pits in SCS, when a rectangle or a square mask opening is accurately aligned with the primary orientation flat of a [100] type silicon wafer, i.e., the [110] direction, only the non-etching [111] planes will be introduced as sidewalls from the very beginning of the etching. During etching, truncated pyramidal pits or V-grooves are generated when the masks are square or rectangle, respectively. After prolonged etching, the bottoms of the truncated pyramids or truncated V-grooves disappear, creating a pyramidal pit or a V-groove, respectively. The angle of the walls of the pyramidal pit or V-groove with respect to the [100] plane of the SCS surface is 54.74 deg., i.e. arctan √2, as shown schematically in FIG. 4A. The walls of the pyramidal pit or V-groove are single [111] crystalline surface planes and as such can be used as plane mirror reference and measurement objects in interferometers. Top views of a pyramidal pit and a V-groove are shown schematically in FIGS. 4B and 4C, respectively. For further discussion of the properties of SCS and the anisotropically etching, reference is made to the book entitled "*Fundamentals of Microfabrication*" by Marc J. Madou (CRC Press, 1997).

Furthermore, while the foregoing alignment marks consist of grooves or pits, in general, alignment marks can take other forms. For example, in some embodiments, alignments marks can be in the form of ridges or projections. V-ridges and/or pyramidal projections, for example, can be fabricated by replication of V-grooves and/or pyramidal pits etched in SCS.

In general, an article in which the alignment marks are formed can be secured to the wafer stage or wafer chuck, or formed directly into the stage or chuck surface. For example, in some embodiments, the pieces of SCS in which pyramidal pits and V-grooves are generated and the substrates on which the pyramidal pits, pyramidal projections, V-grooves, and V-ridges generated by replication are attached to the respective wafer chucks and wafer stages.

In general, a wafer, wafer chuck, and/or wafer stage can include any number of alignment marks. The wafer, wafer chuck, and/or wafer stage should include a minimum number of alignment marks needed to locate the position of the wafer chuck relative to a reference system of a metrology system. Typically, this minimum number is either 2 or 3 depending on the type of alignment mark. For example, including alignment marks that have facets for locating along two axes can reduce the number of alignment marks needed compared to systems that use alignment marks that include a single pair of facets only. Nevertheless, a wafer, wafer chuck, and/or wafer stage can include more than the minimum number of alignment marks. For example, a wafer, wafer chuck, and/or wafer stage can include 4 or more alignment marks (e.g., 5 or more, 6 or more, 8 or more, 10 or more).

Figure 5A:
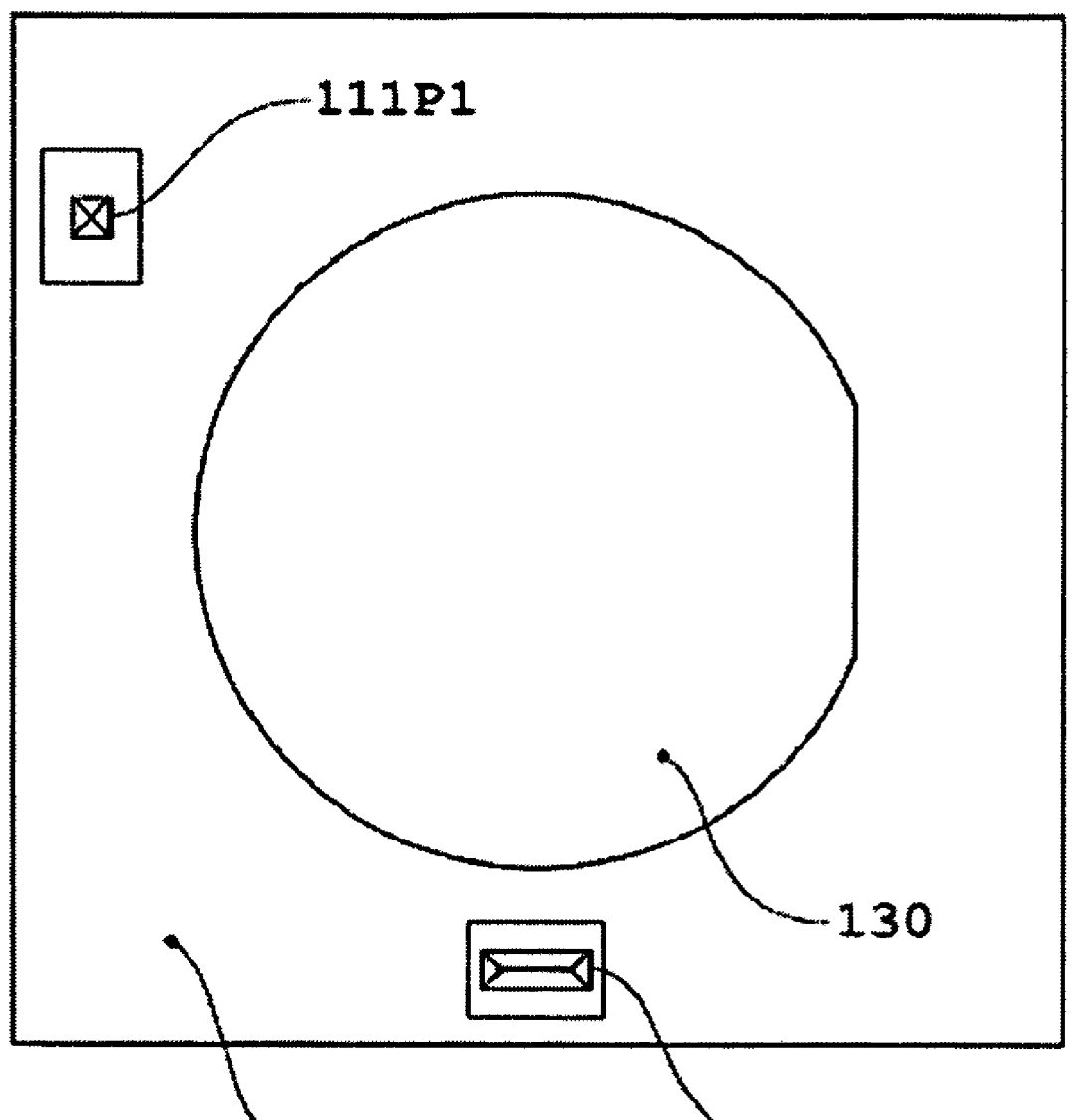
FIGS. 5A, 5B, and 5C are schematic diagrams of different sets of three alignment marks comprising pyramidal pits and V-grooves on a wafer chuck.
Figure 5B:
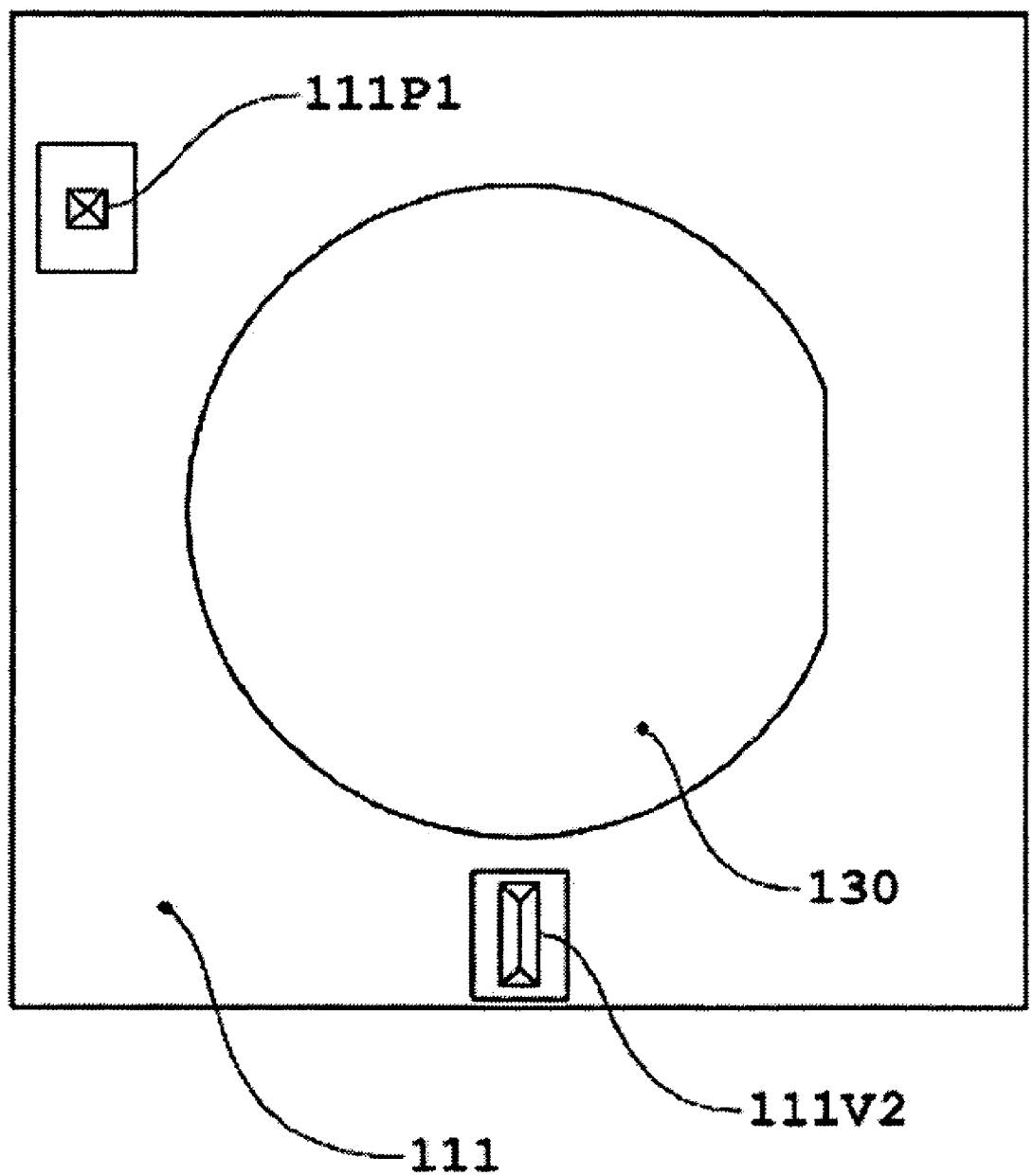
Figure 5C:
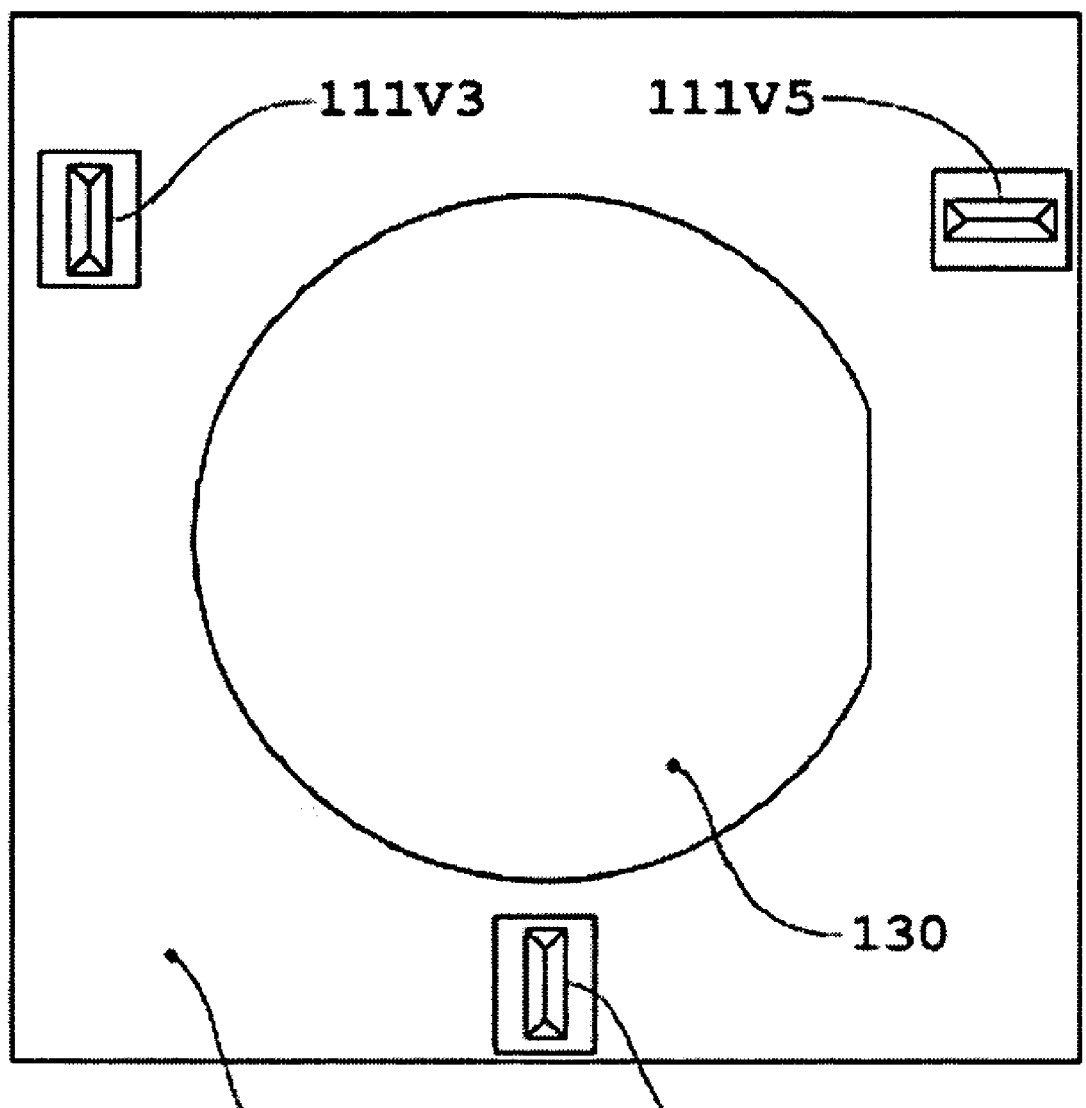

Various alignment mark configurations are shown in FIGS. 5A, 5B, and 5C. The alignment marks in FIG. 5A include a pyramidal pit 111P1 and a V-groove 111V1 aligned in the x -direction. The alignment marks in FIG. 5B include pyramidal pit 111P1 and a V-groove 111V2 aligned in the y-direction. The alignment marks in FIG. 5C include V-groove 111V3 aligned in the y-direction and V-grooves 111V4 and 111V5 aligned in the x-direction. A one degree of freedom sensor, such as white light interferometer 200, is used to locate the transverse position of a V-groove and a two degree of freedom sensor (e.g., a sensor including interferometers 200 and 200S) is used to locate the position of the pyramidal pit in two orthogonal directions. Other arrangements of the alignment marks shown in FIGS. 5A, 5B, and 5C can also be used. An example of such another arrangement is the relocation, i.e., a translation with no rotation, of V-groove 111V1 in FIG. 5A from the lower center of wafer chuck 111 to the upper right corner of wafer chuck 111.

In certain embodiments, three one degree of freedom sensors can be used to simultaneously locate the respective lateral positions of 3 alignment marks, such as V-grooves shown in FIG. 5C. In embodiments where multiple sensors can be used to simultaneously locate corresponding alignment marks, the amount of time required for the alignment of a wafer chuck or wafer stage can be reduced since no additional stage translation is needed for a single alignment sensor can locate multiple widely separated alignment mark sites.

Attaching substrates holding the alignment marks to the wafer stage or wafer chuck can be achieved in a variety of ways. In some embodiments, the positions of the alignment marks are fixed with regard to the wafer chuck such that their relative position is insensitive to external factors, e.g. temperature variations, temporal effects, and the like. This can be accomplished by kinematic attachment between the alignment mark substrates and the wafer chuck. For example, having grooves and pyramids on the both sides of each alignment mark substrate so that the two sides are identical but mirror images can accomplish this. Using hemispheres on the wafer chuck to register with the grooves and pyramids on the backside of the substrate can then assure stable kinematic registration of the alignment marks and the wafer chuck.

In some embodiments, one or more additional white light interferometers can be used to determine the height of object 250. These additional white light interferometers can be based on the interferometer systems and data processing procedures such as described in cited U.S. Pat. Nos. 5,398, 113 and 6,597,460 B2; U.S. Pat. No. 6,822,745 and the two articles entitled "Optical Interferometry For Measuring The Geometric Dimensions Of Industrial Parts" and "Determination Of Fringe Order In White Light Interference Microscopy".

In some embodiments, alignment sensors can be positioned relative to the lithography tool's metrology system so that Abbé offset errors associated with alignment mark locations are reduced (e.g., eliminated). For example, a single axis alignment scope can be located on the x-direction measurement axis of the corresponding interferometer subsystem of the metrology system of the lithographic tool and the second single axis alignment sensor can be located on the y-direction measurement axis of the corresponding interferometer subsystem of the metrology system of the lithographic tool. The artifacts can be, for example, plane gratings (for use with conventional alignment sensors) or V-grooves aligned orthogonal to the measurement axis on which they are respectively located. With reference to stage 120 in FIG. 1B, one single axis alignment sensor can be located on the measurement axis defined by interferometer 125A and displaced from the measurement axis defined by interferometer 125B. A second single axis alignment sensor can be located on the measurement axis defined by interferometer 125B and displaced from the measurement axis defined by interferometer 125A. The net result is reduced (e.g., zero) Abbé offsets in either the x-direction or y-direction.

In certain embodiments, the alignment marks can be located in approximately the same plane as the wafer surface. For example, the alignment marks can be positioned within about 5 mm or less of the wafer surface (e.g., within about 1 mm or less, about 0.5 mm or less, about 0.1 mm or less). Positioning the alignment marks close to or at the plane of the wafer surface can reduce (e.g., eliminate) the Abbé offset errors that can occur due to pitching or yawing of the wafer stage with respect to the x, y, z, co-ordinate system.

Alignment sensors can be used with certain arrays of alignment marks to align components of the stage metrology system. For example, the characterization of certain properties of the plane mirror measurement objects 118B, 118C, 128B, and 128C and 118A and 128A when used. For example, an artifact wafer can be generated by using a [100] wafer and etching pyramidal pits directly in the wafer.

In general, when a lithography tool aligns a wafer, it finds the user-definable locations where the alignment marks are located. In some embodiments, instead of a conventional wafer for processing, the alignment sensors can be used to locate alignment marks on a calibration wafer. A calibration wafer has a number of alignment marks positioned known displacements from each other. Calibration wafers can be used to recalibrate the stage metrology system by monitoring changes between the displacements measured with the metrology system between marks on the calibration wafer over time. In certain embodiments, a calibration wafer includes six to eight alignment mark sites located at about 70% of the wafer radius from the center of the wafer in a circular fashion. The tool can rotate the stage until each of the alignment marks is located by alignment sensor 190. From this data set, a model (e.g., a linear model) can be determined specifying a wafer grid and/or shot terms. The model can quantify the scaling, rotation and orthogonality of the wafer grid and the exposure shot terms. These model calculations can also quantify the alignment corrections for scaling, rotation and orthogonality of the tool. The model can then be subtracted from the measured alignment data resulting in alignment residuals, or non-linear errors (NLEs). The NLE is used here as a metric of the quality of the level alignment.

A calibration wafer can be used as a standard in not only calibrating the stage metrology system of a lithographic tool but also in calibrating one stage metrology system of one lithographic tool with respect to a stage metrology system of a other lithographic tools. Alternatively, or additionally, a calibration wafer can also be used as a ball plate for inspecting coordinate measuring machines by placing spheres in each of the pyramidal pits. The ability to convert back and fourth from an artifact plate to a ball plate can further provide a technique for comparing lithographic coordinate metrology systems with other coordinate measuring machines.

The operation of interferometers 115B, 115C, 125A, and 125B and sources of systematic errors arising from the interferometry system are next described. These errors can be characterized prior to the tool's use, and/or at times when the tool is offline. Although the components of the interferometry system (e.g., the interferometers and the measurement objects) can be characterized prior to their installation in the tool, it may be advantageous to characterize them once they are installed as sources of the systematic errors can develop during their installation or use. For example, stresses due to the fastening of a stage mirror measurement object to the stage can distort the mirror's surface, resulting in systematic errors. Moreover, due to the use of different measurement objects with each interferometer due to the exchange of changes, errors in the interferometry system should be characterized for each permutation of the interferometry system, and compensated accordingly. Additional sources of systematic errors and methods for their characterization are described below.

Displacement measuring interferometers, such as those used in tool 100, monitor changes in the position of a measurement object relative to a reference object based on an optical interference signal. The interferometer generates the optical interference signal by overlapping and interfering a measurement beam reflected from the measurement object with a reference beam reflected from the reference object.

Figure 6:
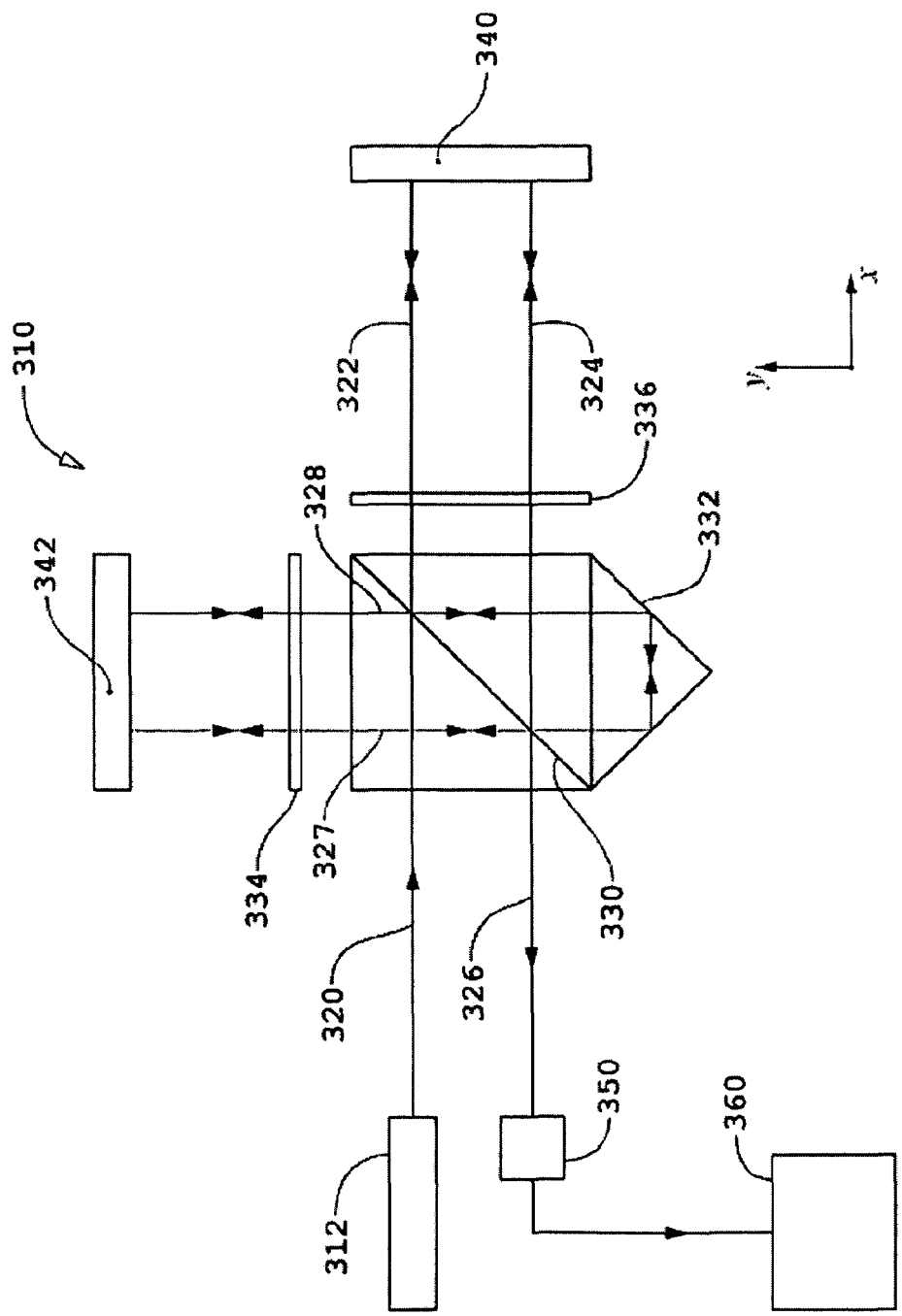
FIG. 6 is a schematic diagram of a high stability plane mirror interferometer (HSPMI).

Referring to FIG. 6, one example of a displacement measuring interferometer which is shown schematically is a high stability plane mirror interferometer (HSPMI) 310. In addition, interferometry 310 includes plane mirror measurement object 340, source 312, detector 350, and electronic processor and computer 360. HSMPI 310 includes polarization beam-splitter 330, retroreflector 332, quarter wave phase retardation plates 334 and 336, and plane mirror reference mirror 342. Source 312 directs an input beam 320 to HSPMI 310, which splits the input beam into two components. One component, shown as first and second pass measurement beams 322 and 324, reflects from measurement object 340 twice before exiting HSPMI 310. The other component, shown by first and second pass reference beams 328 and 327, reflect from a reference mirror 342 twice before exiting HSPMI 310. The exiting beam components overlap, and are shown as output beam 326.

In some embodiments, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

Detector 350 includes a polarizer to mix the reference and measurement beam components of output beam 326 with respect to polarization. Detector 350 measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., due to translating the stage that includes the measurement object, the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects, which in the case of HSPMI 310 is two. Changes in the phase of the measured interference signal correspond to changes in the relative position of the measurement object, e.g., a change in phase of $2\pi$ corresponds substantially to a distance change L of $\lambda/(2np)$. Distance 2L is a round-trip distance change or the change in distance to the measurement object from the interferometer. In other words, the phase $\Phi$, ideally, is directly proportional to L, and can be expressed as $$\Phi = 2pkL. \tag{6}$$

Unfortunately, the observable interference phase, $\tilde{\Phi}$, is not always identically equal to phase $\Phi$. Many interferometers include, for example, non-linearities such as those known as "cyclic errors." The cyclic errors can be expressed as contributions to the observable phase and/or the intensity of the measured interference signal and have a sinusoidal dependence on the change in for example optical path length 2pnL. In particular, a first order cyclic error in phase has for the example a sinusoidal dependence on $(4\pi pnL)/\lambda$ and a second order cyclic error in phase has for the example a sinusoidal dependence on $2(4\pi pnL)/\lambda$. Higher order cyclic errors can also be present as well as sub-harmonic cyclic errors and cyclic errors that have a sinusoidal dependence of other phase parameters of an interferometer system comprising detectors and signal processing electronics.

There are in addition to the cyclic errors, non-cyclic non-linearities, which are also termed "non-cyclic errors." One example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kumit, A. Szöke, F. Zernike, P. H. Lee, and A. Javan, "Accurate Laser Wavelength Measurement With A Precision Two-Beam Scanning Michelson Interferometer," *Applied Optics,* 20(5), 736-757, 1981.

A second source of non-cyclic errors is the effect of "beam shearing" of optical beams across interferometer elements and the lateral shearing of reference and measurement beams one with respect to the other. Beam shears can be caused for example by a change in direction of propagation of the input beam to an interferometer or a change in orientation of the object mirror in a double pass plane mirror interferometer such as the above-described HSPMI.

Accordingly, due to errors such as the aforementioned cyclic and non-cyclic errors, the observable interference phase typically includes contributions in addition to $\Phi$. Thus, the observable phase is more accurately expressed as $$\tilde{\Phi} = \Phi + \psi + \zeta \tag{7}$$

where $\psi$ and $\zeta$ are the contributions due to the cyclic and non-cyclic errors, respectively.

In displacement measuring applications, the observable phase is often assumed equal to 2pkL, which allows one to readily determine L from the measured phase. In many cases, this is a reasonable approximation, particularly where the contributions to due cyclic and/or non-cyclic errors are small, or the level of accuracy required by the application is relatively low. However, in applications demanding a high level of precision, cyclic and/or non-cyclic errors should be accounted for. For example, high precision displacement measurement requirements of integrated circuit micro-lithography fabrication have become very demanding, in part because of the small field limitations of imaging systems in steppers and scanners and in part because of the continuing reduction in the size of trace widths on wafers. The requirement of high precision displacement measurement with steppers and scanners is typically served with plane mirror interferometers with one of the external mirrors of the plane mirror interferometers attached to a stage mirror of the stepper or scanner.

Because the wafer is typically not perfectly flat, the orientation of the wafer stage should also be adjusted in one or more angular degrees of freedom to compensate for the non-flatness of the wafer at exposure sites on a wafer. The combination of the use of plane mirror interferometers and the change in one or more angular degrees of freedom is a source of lateral shear of optical beams across interferometer elements. Effects of beam shears of a reference beam and a measurement beam may be represented effectively as a common mode beam shear and a differential beam shear. The differential beam shear is the difference in lateral shear of reference and measurement and the common mode beam shear is the average lateral shear of the reference and measurement beams.

The aforementioned source of lateral beam shear presents a potentially serious problem in distance measuring interferometry. For a measurement leg length of 1 meter, a typical value for a change in angular orientation of a stage mirror of 0.0005 radians, and a double-pass plane mirror interferometer, the relative lateral shear between the reference and the measurement components of the output beam of the interferometer is 2 millimeters. For a relative lateral shear of 2 millimeters, a beam diameter of 6 millimeters, and wavefront errors in the output beam components of the order of $\lambda/20$, an error will be generated in the inferred distance measurement of >/~1 nanometer. This error is a non-cyclic error and can pose a serious limitation to micro-lithographic applications of steppers and scanners in integrated circuit fabrication.

In addition, wavefront errors are produced by imperfections in transmissive surfaces and imperfections in components such as retroreflectors, phase retardation plates, and/or coupling into multi-mode optical fibers that produce undesired deformations of wavefronts of beams.

Different techniques for quantifying cyclic errors are described in commonly owned U.S. Pat. No. 6,252,668, U.S. Pat. No. 6,246,481, U.S. Pat. No. 6,137,574, and U.S. patent application Ser. No. 10/287,898 entitled "INTERFEROMETRIC CYCLIC ERROR COMPENSATION" filed Nov. 5, 2002 by Henry A. Hill, the entire contents each of which are incorporated herein by reference. In order to compensate for these contributions, cyclic error compensating systems and methods can be used to determine a cyclic error function characterizing the cyclic error contribution to the observed phase. In some embodiments, in order to characterize cyclic errors, systems and methods are employed that analyze multiple measurements of an interference signal corresponding to different optical path length differences to quantify the nonlinearities. In particular embodiments, the time-varying interference signal or the phase extracted from the time-varying interference signal is Fourier transformed and at least some of the nonlinearities are associated with peaks in the square modulus of the Fourier transformed signal (i.e., the power spectrum). The amplitude and phase of the Fourier transform at the frequency of each such peak are used to quantify the associated nonlinearity. The frequency of each peak and whether it can be resolved typically depends on the rate of change of the optical path length difference, i.e., on the Doppler shift. Thus, the systems and methods often analyze multiple time-varying interference signals for each of multiple Doppler shifts to thereby resolve nonlinearities that may otherwise remain hidden, and also, to interpolate the contributions of the nonlinearities to measurements at different Doppler shifts. For example, the contribution of the nonlinearities can be interpolated for measurements when the measurement object is stationary or changing direction, i.e., when the Doppler shift is zero or is passing through zero.

One way to reduce non-cyclic errors in an interferometer is to use extremely high quality optical components. Commercially, this solution is unattractive because of the accompanying increase in cost of the interferometer. Another way to reduce errors is to quantify the errors in the interferometer prior to deploying the interferometer, and then compensate measurements made with the interferometer in its end use application based on the precompiled data.

In some embodiments, quantifying non-cyclic errors associated with an interferometer involves monitoring an observable phase associated with the interferometer output beam while scanning a parameter on which the phase depends. The non-cyclic error contribution to the observable phase is determined from the variation of the observable phase from a reference value, assuming other sources of error are negligible or otherwise compensated. The reference value can be based on another interferometrically generated phase, or can be based on a phase value determined from a mathematical relationship between the observable phase and the parameter being scanned.

Where the reference value is based on another interferometer phase, the reference value can be a redundant phase monitored with a reference interferometer during the scanning. Where the interferometer under test and reference interferometer are configured to monitor the same degree of freedom of the measurement object, the observable phase and redundant phase should be proportional in the absence of non-cyclic errors and other errors. Accordingly, any variation of the observable phase from this relationship can be attributed to the test interferometer non-cyclic errors. Of course, this assumes that the reference interferometer non-cyclic error contribution to the redundant phase measurement is negligible. To ensure this, the reference interferometer can be made using high-quality components to reduce sources of non-cyclic errors in the interferometer. Alternatively, or additionally, the reference interferometer can be operated in a way that reduces non-cyclic errors, e.g., operated a short distance from the measurement object to reduce beam shear, which is a source of non-cyclic errors. Another way to minimize non-cyclic errors in the redundant phase measurement is to use a reference interferometer with known non-cyclic errors. The reference value can then be determined by correcting the observable phase from the reference interferometer with the predetermined non-cyclic error contribution.

Another way to determine a reference value is from a known relationship (e.g., a mathematical formula) relating the scanned parameter to the observable phase. For example, a contribution to the observable phase by the optical path length difference between a measurement beam and a reference beam in an interferometer can be determined from the geometry of the interferometer. This geometric contribution is typically a function of parameters such as the orientation and position of the measurement object with respect to the interferometer. Accordingly, one can monitor the observable phase while scanning one of these parameters, and determine the non-cyclic errors as the variation of the observable phase from the predicted functional dependence of the phase on the scanned parameter.

Non-cyclic error data may be determined for components of interferometers in addition to the whole interferometer assembly. For example, when using a fiber optic pickup (FOP) to transport the interferometer output beam to a remotely positioned detector, artifacts from the interferometer, such as beam shear, can result in additional non-cyclic errors due to coupling the output beam into the FOP. Although these additional non-cyclic errors can be determined for the combined interferometer/FOP assembly, they can also be determined for the FOP alone. The principle for determining the non-cyclic error function for a component is the same as for the interferometer: a system monitors the observable phase generated by an interferometer using the component while scanning a parameter on which the phase depends. The non-cyclic error contribution is determined as the variation of the observable phase from a reference value, assuming that other sources of error are negligible or compensated. In some embodiments, non-cyclic errors in a FOP are measured as functions of differential and common mode beam shear of a two component optical beam, e.g., an output beam of a heterodyne interferometer system.

Important information about the interferometer system in addition to the non-cyclic error function can also be generated in the process of measuring the non-cyclic error function. The additional information may include the measurement axis of the interferometer system as a function of one or more parameters, e.g. the physical length of a measurement path and the directions of propagation of an input beam to the interferometer. For an interferometer assembly including two or more plane mirror interferometers, the process for measuring the non-cyclic error function can also map out the measurement axes for each of the two or more interferometers and may furnish accurate measurement of the separation of the two or more measurement axes. This information may be used to determine changes in angular displacements of the plane mirror measurement object in one or more planes.

Examples of apparatus and details of methods that can be used to characterize non-cyclic errors in interferometers and interferometer components are described in U.S. patent application Ser. No. 10/366,587 entitled "CHARACTERIZATION AND COMPENSATION OF NON-CYCLIC ERRORS IN INTERFEROMETRY SYSTEMS," to Henry A. Hill, filed on Feb. 12, 2003, the entire contents of which are incorporated herein by reference.

Other systematic errors related to the lithography tool interferometry system are also characterized prior to use of the tool. For example, another potential source of systematic errors in the tool's interferometry system mentioned above are imperfections in the reflecting surface of the measurement objects, e.g., variations in the mirror's surface topography. A measure of a mirror's surface topography is the mirror's figure. The figure of each measurement object can be characterized, for example, using a Fizeau interferometer. The figure of the portions of the measurement objects may also be determined by techniques such as described in commonly owned U.S. patent application Ser. No. 09/853,114 entitled "IN-SITU STAGE MIRROR CHARACTERIZATION," filed May 10, 2001, U.S. patent application Ser. No. 10/217,531, also entitled "IN-SITU MIRROR CHARACTERIZATION," filed on Aug. 13, 2002, and U.S. patent application Ser. No. 10/406,749, entitled "METHOD AND APPARATUS FOR STAGE MIRROR MAPPING," filed Apr. 3, 2003, which claims priority to Provisional Patent Application 60/371,172 filed on Apr. 9, 2002, with the same title. These applications name Henry A. Hill as inventor, and the entire contents of each is hereby incorporated by reference.

In some embodiments, the measurement objects are characterized in-situ using the lithography tool interferometers. Each measurement object is characterized using the corresponding interferometer in the exposure position and in the load/unload position. In-situ characterization may be advantageous because what is often important in determining errors associated with a mirror is not necessarily the actual physical deformation of the mirror, but its "effective" optical deformation with respect to the interferometric measurement beam(s) during the lithography exposure cycle. The effective optical deformation includes not only physical deformations in the mirrors, but also optical gradients along the measurement beam path caused by environmental effects, such as heat and air turbulence, produced by the movement of the stage during the photolithography exposure cycle. Such optical gradients can modify the propagation properties of the interferometric measurement beams in the same way as physical deformations in the mirrors. Thus, in some embodiments, the lithography tool implements a mirror characterization procedure in-process to incorporate the environmental effects into the characterization. The characterization is then used to correct in-process interferometric measurements of the stage.

Accordingly, systematic and random errors associated with the measurement objects may be compensated. The corrections account for pre-installation imperfections in the mirrors, deformations in the mirror caused by their installation, and environmental effects during a photolithographic exposure cycle that affect how the mirror surface "appears" to the interferometer used to monitor the stage position. Moreover, the corrections compensate for any in-process degradation of the mirror surfaces due to, e.g., delamination or dirt. Furthermore, the corrections may be averaged and continually updated during multiple cycles of the photolithography exposure cycle to improve their statistically accuracy without compromising the throughput of the lithography tool.

Such mirror characterization techniques can be based on interferometrically measuring the stage position with respect to multiple metrology axes to provide redundant information about the stage position. For example, in-plane rotation of the wafer stage may be measured twice based on separate interferometric measurement beams that contact two different sides of the wafer stage. The two in-plane rotation measurements may then be repeated as the position of the stage is stepped or scanned along a first axis (e.g., the x-axis). Differences between the multiple redundant measures may then be attributed to the effective optical deformation of a first stage mirror oriented parallel to that first axis. The process may then be repeated for multiple translations of the stage along a second axis (e.g., the y-axis) orthogonal to the first axis to determine the effective optical deformation of a second stage mirror oriented parallel to the second axis.

Characterizing an interferometer's systematic errors in these ways can yield one or more phase terms that are a function of the scanned parameters. These phase terms may be stored as, for example, a look-up table, as a power series representation, or as a spectral representation such as in a Fourier series. The phase terms for each interferometer may be the same for the different stages' measurement objects, but are more likely different. Scanned parameters may include the measurement object's position and/or orientation with respect to the interferometer, the position of the interferometer axis with respect to the pivot axis of the measurement object, beam shear, and directions of propagation of measurement and/or reference beams.

The error data may be stored on some electronic data storage medium (e.g., a memory chip or a disk), which is provided to the interferometer's end user. A control algorithm that runs the interferometry system in the tool accesses the non-cyclic error function from the data storage medium, and compensates the observable phase prior to making downstream calculations based on the phase.

Although the foregoing description refers to specific components and configurations of lithography tool 100, the similar concepts can be used in other embodiments. For example, although the foregoing description is with reference to HSPMIs, in general, other types of displacement measuring interferometers can be used. Different types of interferometers include both single and multiple pass interferometers (the HSPMI is a double pass interferometer), and include passive interferometers, dynamic interferometers, and dispersion interferometers. Alternatively, or additionally, lithography tool 100 can include interferometers that monitor more than one degree of freedom, interferometers that monitor variations in angular orientation of a measurement object, and angular displacement interferometers that measure beam propagation direction.

Examples of dynamic interferometers are described in U.S. patent application Ser. No. 10/226,591 filed Aug. 23, 2002 and entitled "DYNAMIC INTERFEROMETER CONTROLLING DIRECTION OF INPUT BEAM" by Henry A. Hill. Examples of passive zero shear interferometers are described in U.S. patent application Ser. No. 10/207,314, entitled "PASSIVE ZERO SHEAR INTERFEROMETERS," filed Jul. 29, 2002, by Henry A. Hill. Examples of angular displacement interferometers are described in: U.S. patent application Ser. No. 10/226,591 entitled "DYNAMIC INTERFEROMETER CONTROLLING DIRECTION OF INPUT BEAM," filed Aug. 23, 2002; U.S. Provisional Application 60/314,345 filed Aug. 22, 2001 and entitled "PASSIVE ZERO SHEAR INTERFEROMETERS USING ANGLE SENSITIVE BEAM-SPLITTERS," both by Henry A. Hill, and U.S. patent application Ser. No. 10/272,034 entitled "INTERFEROMETERS FOR MEASURING CHANGES IN OPTICAL BEAM DIRECTION" and filed Oct. 15, 2002 by Henry A. Hill and Justin Kreuzer. Alternatively, or additionally, interferometry systems may include one or more differential angular displacement interferometers, examples of which are also described in U.S. patent application Ser. No. 10/272,034. Examples of interferometry systems for measuring more than one degree of freedom and for reducing beam shear are described in U.S. patent application Ser. No. 10/352,616 filed Jan. 28, 2003 and entitled "MULTIPLE-PASS INTERFEROMETRY" by Henry A. Hill. Other forms of multiple pass interferometers are described in an article entitled "Differential interferometer arrangements for distance and angle measurements: Principles, advantages and applications" by C. Zanoni, VDI Berichte Nr. 749, 93-106 (1989). Examples of two-wavelength dispersion interferometers are described in U.S. Pat. No. 6,219,144 B1 entitled "APPARATUS AND METHOD FOR MEASURING THE REFRACTIVE INDEX AND OPTICAL PATH LENGTH EFFECTS OF AIR USING MULTIPLE-PASS INTERFEROMETRY" by Henry A. Hill, Peter de Groot, and Frank C. Demarest and U.S. Pat. No. 6,327,039 B1 by Peter de Groot, Henry A. Hill, and Frank C. Demarest.

Furthermore, while in tool 100 the measurement objects are mounted on the stages and the interferometers are mounted on the frame, other configurations may be employed. For example, the interferometers can be mounted on the stages and the measurement objects on the frame. In some embodiments, the detectors can be located at a location remote from the interferometer, and the output beam can be directed to the detector using a fiber optic pickup (FOP). Some embodiments may include a column reference, which is described above.

In some embodiments, where the mask is regularly changed, a second mask stage can be employed in a similar fashion to the twin wafer stages. Where interferometers are used to monitor the mask positions, similar concepts to those described above may be employed to increase system throughput and/or improve accuracy of mask positioning. More generally, the concepts disclosed herein may be applied to other systems that utilize interferometric monitoring of component positions, wherein the component being monitored changes at different stages during operation.

A number of embodiments of the invention have been described. Nevertheless, it will be understood that various modifications may be made without departing from the spirit and scope of the invention.

Additional embodiments are in the claims.

What is claimed is:

1. A lithography system, comprising:
a stage for supporting a wafer;
an illumination system including a radiation source and a lens assembly, wherein the illumination system is configured to direct radiation through a mask to produce spatially patterned radiation, and the lens assembly is configured to image the spatially patterned radiation onto the wafer;
a first interferometry system configured to monitor a location of the stage within the lithography system as the stage moves relative to the illumination system;
a second interferometry system comprising an interferometer configured to direct two beams from a common light source along different paths to a surface associated with the stage, the second interferometry systems being configured to identify an alignment feature on the surface associated with the stage based on an output beam formed from light from the two beams specularly reflected from the alignment feature; and
an electronic controller coupled to the interferometry systems, wherein the electronic controller is configured to determine information about a location of the stage when the alignment feature is identified.

2. The lithography system of claim 1, wherein the information comprises a location of the stage along a first axis within the lithography system.

3. The lithography system of claim 2, wherein the first interferometry system is configured to monitor the location of the stage along the first axis and along a second axis within the lithography system as the stage moves relative to the illumination system, wherein the second axis is different from the first axis.

4. The lithography system of claim 3, wherein the second interferometry system is configured to identify a second alignment feature on a surface associated with the stage.

5. The lithography system of claim 4, wherein the information further comprises a location of the stage along the second axis within the lithography system.

6. The lithography system of claim 5, wherein the first and second axes are in a plane nominally parallel to a plane of the wafer.

7. The lithography system of claim 1, wherein the surface is a surface of the stage.

8. The lithography system of claim 1, wherein the surface is a surface of the wafer.

9. The lithography system of claim 1, wherein the surface is a surface of a wafer chuck supported by the stage.

10. The lithography system of claim 1, wherein the alignment feature is located within about 0.5 mm or less from a plane of a surface of the wafer.

11. An interferometry system for identifying an alignment feature on a surface associated with a stage within a lithography tool, the interferometry system comprising:
an interferometer configured to direct two beams derived from a common light source along different paths and to combine light from the two beams that is specularly reflected from the alignment feature to form an output beam comprising information about the location of the alignment feature with respect to the two beams.

12. The interferometry system of claim 11, further comprising an electronic controller configured to determine information about a location of the stage within the lithography tool when the alignment feature is identified.

13. The interferometry system of claim 12, wherein interferometry system identifies the alignment feature when the alignment feature is at a location where an optical path length difference between the two beam paths is about zero.

14. The interferometry system of claim 11, wherein the common light source has a coherence length of about 1 cm or less.

15. The interferometry system of claim 11, wherein the common light source is a broadband light source.

16. The interferometry system of claim 11, wherein the paths of the two beams each have a component parallel to the surface associated with the stage.

17. The interferometry system of claim 11, wherein the paths of the two beams each have a component normal to the surface associated with the stage.

18. The interferometry system of claim 11, wherein the interferometer comprises one or more focusing elements that focus the two beams to respective waists.

19. The interferometry system of claim 18, wherein the alignment feature is identified when the alignment feature is located at the respective beam waists.

20. The interferometry system of claim 11, wherein the interferometer is a Michelson interferometer.

21. The interferometry system of claim 11, wherein the interferometer has a numerical aperture for both of the two beams of about 0.1 or less.

22. The interferometry system of claim 11, wherein the interferometer comprises a beam splitter configured to split an input beam originating from the light source into the two beams.

23. The interferometry system of claim 22, wherein the beam splitter includes a beam splitting interface and the beam splitter is physically symmetric with respect to the interface.

24. The interferometry system of claim 12, further comprising a detector in communication with the electronic controller, the detector being configured to monitor the intensity of the output beam as the stage is moved within the lithography tool.

25. The interferometry system of claim 24, wherein the detector has a maximum detection frame rate of about 1 MHz or more.

26. The interferometry system of claim 24, wherein the detector comprises an array of detection elements.

27. The interferometry system of claim 24, wherein the detector comprises a single detection element.

28. The interferometry system of claim 11, wherein the alignment feature comprises a first facet and a second facet opposite the first facet.

29. The interferometry system of claim 28, wherein one of the two beams reflects from the first facet and the other of the two beams reflects from the second facet when the alignment feature is identified.

30. The interferometry system of claim 28, wherein the first facet is substantially orthogonal to the path of one of the two beams when the alignment is identified.

31. The interferometry system of claim 29, wherein the second facet is substantially orthogonal to the path of the other of the two beams when the alignment feature is identified.

32. A lithography tool, comprising:
a stage for supporting a wafer;
an illumination system including a radiation source and a lens assembly, wherein the illumination system is configured to direct radiation through a mask to produce spatially patterned radiation, and the lens assembly is configured to image the spatially patterned radiation onto the wafer;
a first interferometry system configured to monitor a location of the stage within the lithography system as the stage moves relative to the illumination system;
the interferometry system of claim 11; and
an electronic controller coupled to the interferometry systems, wherein the electronic controller is configured to determine information about a location of the stage when the alignment feature is identified.

33. A method, comprising:
directing two beams derived from a common source along different paths to contact a surface associated with a wafer stage; and
combining light from the two beams that is specularly reflected from an alignment feature in the surface to form an output beam comprising information about the location of the alignment feature with respect to the two beams.

34. A method, comprising:
monitoring a location of a stage within the lithography system comprising an illumination system as the stage moves relative to an illumination system;
using an interferometry system to identify an alignment feature on a surface associated with the stage by directing two beams derived from a common source along different paths to contact the surface associated with the stage and monitoring an output beam formed from light from the two beams specularly reflected from the alignment feature; and
determining information about a location of the stage within the lithography system when the alignment feature is identified.

35. A lithography system, comprising:
a stage for supporting a wafer;
an illumination system including a radiation source and a lens assembly, wherein the illumination system is configured to direct radiation through a mask to produce spatially patterned radiation, and the lens assembly is configured to image the spatially patterned radiation onto the wafer;
a first interferometry system configured to monitor a location of the stage within the lithography system as the stage moves relative to the illumination system;
a second interferometry system comprising an interferometer configured to direct two beams from a common light source along different paths to a surface associated with the stage, the second interferometry systems being configured to identify an alignment feature, on the surface associated with the stage based on an output beam formed from light from the two beams reflected from the alignment feature; and an electronic controller coupled to the interferometry systems, wherein the electronic controller is configured to determine information about a location of the stage when the alignment feature is identified;

wherein the second interferometry system comprises an optical element that is configured to both direct the light from one of the two beams toward the alignment feature and receive light reflected from the alignment feature, where the second interferometer forms the output beam using light reflected from the alignment feature received by the optical element.

36. The lithography system of claim 35, wherein the optical element is a focusing element with a numerical aperture of 0.1 or less.

37. A lithography system, comprising:

a stage for supporting a wafer;

an illumination system including a radiation source and a lens assembly, wherein the illumination system is configured to direct radiation through a mask to produce spatially patterned radiation, and the lens assembly is configured to image the spatially patterned radiation onto the wafer;

a first interferometry system configured to monitor a location of the stage within the lithography system as the stage moves relative to the illumination system;

a second interferometry system comprising an interferometer configured to direct two beams from a common light source along different paths to a surface associated with the stage, the second interferometry systems being configured to identify an alignment feature on the surface associated with the stage based on an output beam formed from light from the two beams reflected from the alignment feature; and an electronic controller coupled to the interferometry systems, wherein the electronic controller is configured to determine information about a location of the stage when the alignment feature is identified;

wherein the common light source is a broadband light source.

38. A lithography system, comprising:

a stage for supporting a wafer;

an illumination system including a radiation source and a lens assembly, wherein the illumination system is configured to direct radiation through a mask to produce spatially patterned radiation, and the lens assembly is configured to image the spatially patterned radiation onto a surface of the wafer;

a first interferometry system configured to monitor a location of the stage within the lithography system as the stage moves relative to the illumination system;

a second interferometry system comprising an interferometer configured to direct a first beam and a second beam from a common light source along different paths to a surface associated with the stage, the second interferometry systems being configured to identify an alignment feature on the surface associated with the stage based on an output beam formed from light from the first and second beams reflected from the alignment feature; and an electronic controller coupled to the interferometry systems, wherein the electronic controller is configured to determine information about a location of the stage along a first axis when the alignment feature is identified;

wherein the alignment feature comprises a first facet and a second facet opposite the first facet, wherein the first and second facets are non-parallel to the surface of the wafer and have an area larger than a cross sectional area of the first and second beams, respectively, at the surface.

39. The lithography system of claim 38, wherein the alignment feature comprises a V-shaped pit or groove, or a pyramidal pit or groove in the surface and the first and second facets are facets of the V-shaped or pyramidal pit or groove.

* * * * *